United States Patent [19]

Katoozi

[11] Patent Number: 5,515,383
[45] Date of Patent: May 7, 1996

[54] BUILT-IN SELF-TEST SYSTEM AND METHOD FOR SELF TEST OF AN INTEGRATED CIRCUIT

[75] Inventor: Mehdi Katoozi, Bellevue, Wash.

[73] Assignee: The Boeing Company, Seattle, Wash.

[21] Appl. No.: 706,403

[22] Filed: May 28, 1991

[51] Int. Cl.$^6$ .................................................. G01R 31/28
[52] U.S. Cl. ........................................................ 371/22.4
[58] Field of Search ................................ 371/22.4, 22.5, 371/3

[56] References Cited

U.S. PATENT DOCUMENTS

| | | | |
|---|---|---|---|
| 3,573,728 | 4/1971 | Kolankowsky et al. | 340/146.1 |
| 3,891,969 | 6/1975 | Christensen | 340/146.1 AL |
| 4,151,510 | 4/1979 | Howell et al. | 340/146.1 AL |
| 4,201,976 | 5/1980 | Patel | 371/50 |
| 4,216,539 | 8/1990 | Raymond | 371/22.4 |
| 4,262,358 | 4/1981 | Marino, Jr. | 371/51 |
| 4,397,022 | 8/1983 | Weng et al. | 371/37 |
| 4,456,980 | 6/1984 | Yamada et al. | 365/200 |
| 4,468,769 | 8/1984 | Koga | 371/37 |
| 4,513,418 | 4/1985 | Bardell | 371/22.4 X |
| 4,519,079 | 5/1985 | Hamer | 371/38 |
| 4,538,270 | 8/1985 | Goodrich, Jr. et al. | 371/37 |
| 4,551,838 | 11/1985 | Gannett | 371/22.4 |
| 4,594,711 | 6/1986 | Thatte | 371/22.3 |
| 4,597,080 | 6/1986 | Thatte et al. | 371/25 |
| 4,652,814 | 3/1987 | Groves et al. | 324/73 R |

(List continued on next page.)

FOREIGN PATENT DOCUMENTS

| | | | |
|---|---|---|---|
| 2838-493 | 6/1979 | Germany | G06F 11/08 |
| 2817-863 | 8/1979 | Germany | G11C 29/00 |
| 2817-864 | 8/1979 | Germany | G06F 11/10 |
| 57-152597A | 9/1982 | Japan | G11C 29/00 |

OTHER PUBLICATIONS

Chang, Herbert Y., "An Algorithm for Selecting an Optimum Set of Diagnostic Tests," IEEE Transactions on Electronic Computers, vol. EC–14, No. 5, Oct. 1965, pp. 706–711.
Zook, G. M., "ECC and Parity Domain Conversion Checking," IBM Technical Disclosure Bulletin, vol. 12, No. 10, Mar. 1970, pp. 1647–1649.
Boden, R. C., "Self–Checked Error–Correction Code Generator, ECC Comparer, Error Syndrome Decoder and Data Bit Corrector," IBM Technical Disclosure Bulletin, vol. 15, No. 5, Oct. 1972, pp. 1549–1551.
Muehldorf, E. I., et al., "Embedded Macro Test Pattern Generation," IBM Technical Disclosure Bulletin, vol. 20, No. 1, Jun. 1977, pp. 197–199.
"Test Pattern Generation for Memory," IBM Technical Disclosure Bulletin, vol. 31, No. 2, Jul. 1988, pp. 116–118.
"Fault–Tolerant Self–Checking Parity Checker for Multiple Independent Data Paths," IBM Technical Disclosure Bulletin, vol. 32, No. 8A, Jan. 1990, pp. 200–203.

Primary Examiner—Robert W. Beausoliel, Jr.
Assistant Examiner—Glenn Snyder
Attorney, Agent, or Firm—Christensen, O'Connor, Johnson & Kindness

[57] ABSTRACT

A built-in self-test system and method for use in testing an integrated circuit. An integrated circuit (200) includes a self-test generator (210) that produces pseudo-random test vectors, each having fewer bits than a normal input signal applied to the integrated circuit. The normal signal comprises data and parity bits that are applied to a plurality of error detection and correction (EDAC) circuits (50) on the integrated circuit. Selected bits of the pseudo-random test vectors generated by the self-test generator are fanned out to provide the total number of bits of the data and parity signals, and a test signature is produced after a full set of test vectors have been processed by the EDAC. A signature analyzer (222) compares the test signature with a predetermined expected signature to determine if a fault has occurred in one of the EDACs in the integrated circuit. The self test can be made upon demand, or alternatively, can be run pseudo-concurrently with the normal mode, using cycle stealing.

27 Claims, 12 Drawing Sheets

U.S. PATENT DOCUMENTS

| | | | |
|---|---|---|---|
| 4,701,916 | 10/1987 | Naven | 371/22.4 X |
| 4,706,248 | 11/1987 | Masaki | 371/3 |
| 4,718,065 | 1/1988 | Boyle | 371/22.4 X |
| 4,736,376 | 4/1988 | Stiffler | 371/37 |
| 4,805,173 | 2/1989 | Hillis et al. | 371/38 |
| 4,862,399 | 8/1989 | Freeman | 364/580 |
| 4,910,735 | 3/1990 | Yamashita | 371/22.4 |
| 4,918,378 | 4/1990 | Katirciogin et al. | 365/201 |
| 4,975,641 | 12/1990 | Tanaka | 371/22.5 X |
| 5,081,626 | 1/1992 | Scott | 371/22.4 |
| 5,184,067 | 2/1993 | Nozuyama | 371/22.4 X |

BUILT-IN SELF-TEST SYSTEM AND METHOD FOR SELF TEST OF AN INTEGRATED CIRCUIT

TECHNICAL FIELD

This invention generally pertains to a system and method for self test of an integrated circuit, and specifically, to a built-in self-test system and method for testing fully combinational integrated circuits.

BACKGROUND OF THE INVENTION

Provision of a built-in, self-test capability within an integrated circuit enables faults or other problems that might arise in the operation of the circuit to be identified much more rapidly than might occur as the result of periodically scheduled, externally applied tests. Immediate identification of such faults can be extremely important in certain applications, especially those involving human safety. For example, failure of integrated circuits used in aviation systems may pose a significant risk to the lives of all the passengers on an aircraft. To minimize the impact of such failures, multiple redundant integrated circuits are often used, particularly in critical components. Early detection of a problem, even in a multiple redundant system, can provide an improved safety margin by permitting corrective action to be taken as soon as possible. For example, once a failed component is detected in a critical system, the system can reconfigure itself to use other redundant components, locking out the failed component.

A fault in certain types of integrated circuits might not readily be detected until a test of all possible operating states of the circuit revealed the problem, since the input data normally processed by the circuit may have a relatively limited range. Accordingly, any self test that relies upon normal input data to evaluate an integrated circuit's operation may fail to properly detect a problem. External test circuitry used to generate a full range of operating states that are required to completely test an integrated circuit can add significant cost and operating overhead to a system, particularly where normal use of an integrated circuit is interrupted to implement its test. A self test can be initiated each time a circuit is energized, at periodic timed intervals during its use, or on demand; however, a conventional self test usually interrupts the normal operation and function of the circuit under test. This interruption typically continues until the test is fully completed. However, for critical systems in which each component should be fully tested from time to time during continued operation of the system, it may not be possible to interrupt the normal operation to carry out a test of specific key components.

For example, a multiple redundant central processing unit and memory system on an aircraft or in other critical applications may use a plurality of error detection and correction (EDAC) circuits connected between the multiple central processing units and memory circuits to insure that data written to memory are accurately stored and read back from memory. It would be impractical to externally periodically apply a test signal to the EDACs to test for a fault, since they would have to be rendered inoperative during such a test. Providing an external test signal generator for each EDAC would also be prohibitively expensive. Yet, fault-free operation of each EDAC in the redundant system is critical to the system's overall reliability. One solution to this problem is to use a technique called "cycle stealing" that is described in commonly assigned U.S. Pat. No. 5,144,230. This technique allows a self test to be run concurrently with the normal operation of the circuit under test. At least a portion of the self test is completed during each clock cycle while the circuit is not being used for its normal function. The technique thus allows a full test of a circuit to be completed over a number of clock cycles without any interruption of the normal functions provided by the circuit.

Self test using cycle stealing solves part of the problem. However, it may not be economical to provide a full test generator on each integrated circuit being tested, e.g., on each EDAC. One test generator can simultaneously test several EDACs, but although use of a single test generator to provide the test signal for a plurality of such devices helps to defray the cost, it does not represent a complete solution to the problem. The self-test system should be low in cost and fully integrated into the circuit comprising the devices to be tested.

Accordingly, an object of this invention is to provide an economical built-in self-test system for testing an integrated circuit. It is a further object to provide a built-in self-test system for testing a plurality of common sub-circuits comprising the integrated circuit. Yet a further object is to provide a self-test system that minimizes the cost of a test generator used to generate test signals capable of substantially fully testing the integrated circuit. A still further object is to provide a self-test system and method that is usable to test an EDAC. These and other advantages and objects of the invention will be apparent from the attached drawings and the Description of the Preferred Embodiments that follows.

SUMMARY OF THE INVENTION

In accordance with the present invention, a built-in self-test system for determining if a fully combinational integrated circuit has a fault is defined, wherein the integrated circuit is selectively operable in either a normal mode or in a self-test mode. The integrated circuit has an input port to which a binary input signal is applied and an output port for producing an output signal in response to the input signal. The self-test system comprises a self-test generator that produces a self-test signal having fewer total binary bits than the input signal applied when the integrated circuit is operating in the normal mode; the self-test generator is integrally disposed on the integrated circuit. Means are included for fanning out selected binary bits of the self-test signal to provide a total number of binary bits equal to the total binary bits of the normal input signal. The means for fanning out are connected to the input port of the integrated circuit, and the selected bits are predetermined so as to minimize a total number of different test vectors that must be applied to substantially fully test the integrated circuit. Signature analyzer means are integrally disposed on the integrated circuit and are connected to receive the output signal of the integrated circuit that is produced while the integrated circuit is operating in the test mode. The signature analyzer means produce a test signature from the output signal and compare the test signature to a predetermined expected signature, producing a fault signal indicative of any difference between the test signature and the expected signature.

Means are also provided for selectively applying the self-test signal to the input port of the integrated circuit only during the self-test mode, so that the normal input signal is otherwise applied.

The self-test generator preferably comprises a linear feedback shift register, and the self-test mode comprises generation of a plurality of pseudo-random bit patterns by the linear feedback shift register in sufficient variety to substantially fully self test the integrated circuit. Each bit pattern comprises a vector of the self-test signal.

The means for fanning out the self-test signal use predefined bits that are selected so as to minimize the number of vectors of the self-test signal required to substantially fully self test the integrated circuit.

Preferably, the signature analyzer means comprise linear reduction means connected to receive the output signal produced by the integrated circuit during operation in the self-test mode, for reducing the number of bits in the output signal prior to determining the test signature.

In one form of the invention, the integrated circuit includes a plurality of sub-circuits, each of which selectively operates in either the normal mode or the self-test mode, and each of which includes an input port and an output port. The means for fanning out selectively apply the test vectors to each input port of the sub-circuits so that they each produce an output signal corresponding thereto. The signature analyzer means are connected to receive the output signal of the sub-circuits, produce a corresponding test signature for the sub-circuits, and compare that test signature to the predetermined expected signature, producing a fault signal indicative of any difference between the test signature of the sub-circuits and the expected signature.

In addition, the system can comprise a clock that produces a timing signal determining cycles of the normal mode, and controller means for selectively initiating the self-test mode. The controller means can selectively initiate the self-test mode during portions of the cycles when the integrated circuit is available to process the self-test signal without interfering with the normal mode, or prior to the start of the normal mode, or upon receipt of a self-test initiate signal from an external source. In the latter ease, the self-test mode is entered upon demand.

A further aspect of the invention is a method for integrated self testing of a fully combinational integrated circuit. The method includes steps that are generally consistent with the functions performed by the elements comprising the system described above.

DESCRIPTION OF THE PREFERRED EMBODIMENTS

The following Description of the Preferred Embodiments is directed to an exemplary application of the built-in self-test system and method for self test of an integrated circuit used for a specific function. However, it is not intended that the description of this application in any way limit the scope of the invention, since it should be apparent that the self-test system and method have application to virtually any type of fully combinational circuit that produces a defined output signal in response to a given input signal. For example, the self-test system and method could be applied to evaluate the operation of an arithmetic logic unit, a multiplier, and other fully combinational circuits.

As noted above in the Background of the Invention, requirements for self testing are particularly important in modern commercial avionics, where flight critical data are processed by fault-tolerant digital computers. These relatively complex fault-tolerant systems trade off operating speed to achieve the data integrity required when system reliability is directly linked with the protection of human lives. The present invention is particularly relevant to self testing such systems.

Figure 1:
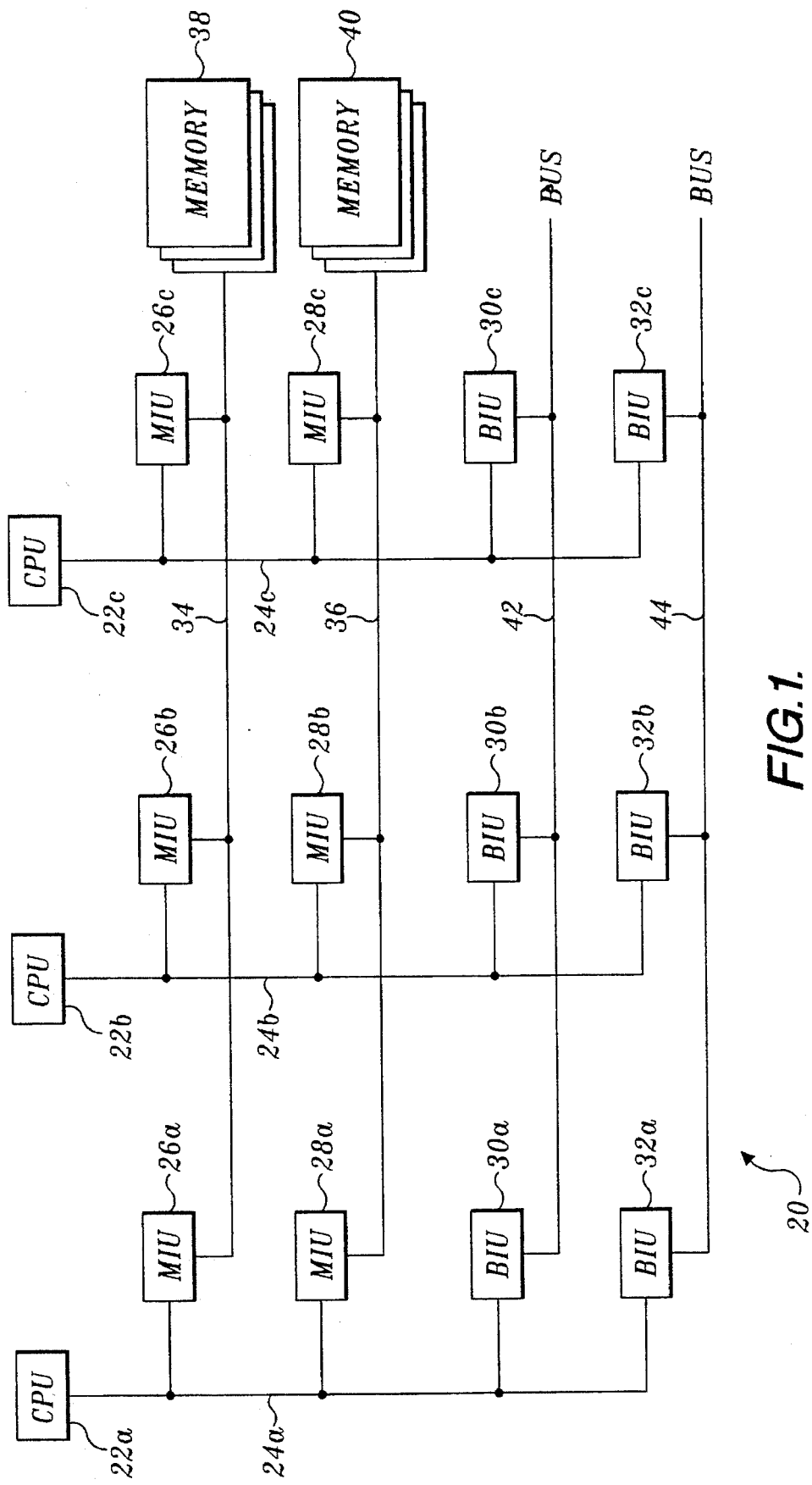
FIG. 1 is a schematic block diagram of a multiply redundant central processor and memory system with which the present invention is used.

FIG. 1 systematically represents a fault-tolerant digital computer system, shown generally at reference numeral 20. Fault-tolerant computer system 20 includes redundant central processing units (CPUs) 22a, 22b, and 22e, each of which redundantly process the same data. Each CPU 22 is connected by corresponding data lines 24 to plural memory interface units (MIUs) 26 and 28, and to plural bus interface units (BIUs) 30 and 32. Specifically, data lines 24a connect CPU 22a to MIUs 26a and 28a, and to BIUs 30a and 32a; CPU 22b is connected by data lines 24b to MIUs 26b and 28b, and to BIUs 30b and 32b; and CPU 22c is connected by data lines 24c to MIUs 26c and 28c, and to BIUs 30c and 32c. Each of the MIUs 26 are connected by data lines 34 to separate memory circuits 38, and each of the MIUs 28 are connected by data lines 36 to separate memory circuits 40. Similarly, BIUs 30 are each connected to a data bus 42, and BIUs 32 are each connected to a data bus 44.

Although not separately shown, the MIUs typically each include error detection and correction (EDAC) circuits to insure that the data written to memory circuits 38 and 40 are stored correctly and that at least single errors detected in data stored in or retrieved from memory circuits 38 and 40 are corrected. Accordingly, the EDACs included within MIUs 26 and 28 play a very important role in fault-tolerant digital computer system 20. If any one of the EDACs fails, it is important that the MIU 26 or 28 in which it is disposed be locked out of the system to prevent erroneous data from being used by CPUs 22. The present invention can thus play an important role in self testing the EDACs within each of the MIUs 26 and 28 of digital computer system 20 to quickly identify faults in the EDACs during operation of the system, or alternatively, as the result of an "on demand" self test.

Figure 2:
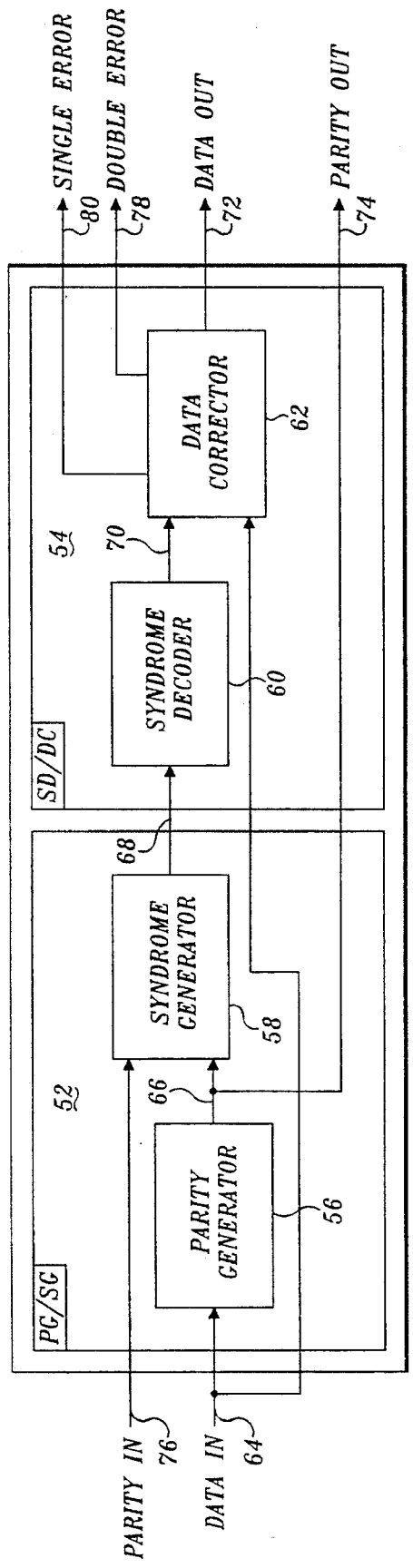
FIG. 2 is a schematic block diagram of a prior art EDAC circuit that is self tested using the present invention.

FIG. 2 shows a typical prior art EDAC 50. EDAC 50 can be divided into two sections, including a parity generator/syndrome generator (PG/SG) section 52 and a syndrome decoder/data corrector (SD/DC) section 54. PG/SG section 52 is purely linear, comprising exclusive-OR gate logic, and is a fully bit-sliced circuit. Conversely, SD/DC section 54 is non-linear and has a much higher characteristic fanin than the other section. PG/SG section 52 includes a parity generator block 56 and a syndrome generator block 58. SD/DC section 54 includes a syndrome decoder block 60 and a data corrector block 62.

Although the function of EDACs are well known to those of ordinary skill in the art, it may be helpful in better understanding application of the present invention for self testing these devices to provide some background information concerning the operation of EDAC 50. Parity generator block 56 is connected to receive input data over data lines 64. The input data are also supplied to data corrector block 62. In this exemplary application of the present invention, it is assumed that EDAC 50 is designed to process 16 bits of data, producing six parity bits and is thus conventionally referred to as a (22,16) EDAC. As will be apparent, other types of EDACs could be used, for example, a (39,32) EDAC having the ability to process 32 bits of data, producing seven parity bits; however, the technique employed in the present invention for self testing virtually any type of fully combinational circuit follows substantially the same steps.

During a write-to-memory operation, the binary data being stored are input to EDAC 50. Upon receiving the 16 bits of data, parity generator block 56 generates six parity bits that are output over parity lines 74. The 16 data bits are output from EDAC 50 over data lines 72. The parity and data signals thus total 22 bits and are stored in memory at a specified address. Subsequently, during a memory-read operation, the 22 bits stored therein are read out of memory. The six parity bits are applied through parity lines 76 to syndrome generator block 58, and the 16 data bits are applied through data lines 64 to parity generator block 56. The parity generator block again produces six parity bits from the data that were stored, and these parity bits are applied over lines 66 to syndrome generator block 58 and to data corrector block 62. If the parity bits that were originally generated and stored in memory with the data are exactly the same as the parity bits generated from the data stored in memory, syndrome generator block 58 produces a syndrome signal comprising six zeroes, that is conveyed to syndrome decoder block 60 over lines 68. However, if one or more differences between the two sets of parity bits exist, the syndromes generated include one or more binary "1s" indicating that a memory error occurred. Syndrome decoder block 60 processes the syndromes to determine which of the data bits retrieved from memory differ from the data bits originally stored in memory, and produces a signal that is conveyed over lines 70 to data corrector block 62, enabling it to correct at least one such error in the retrieved data bits. Data corrector block 62 can correct only one bit of the retrieving data using the decoded syndromes. When a single such error is detected, it produces a single error signal over a single error line 80. If more than one error is detected, data corrector block 62 produces a double error signal on a double error line 78. To the extent that the data retrieved from memory either have no errors or only a single error (which has been corrected), the correct data are output over lines 72 for use by a connected CPU, such as by one of CPUs 22 (in FIG. 1).

Figure 3:
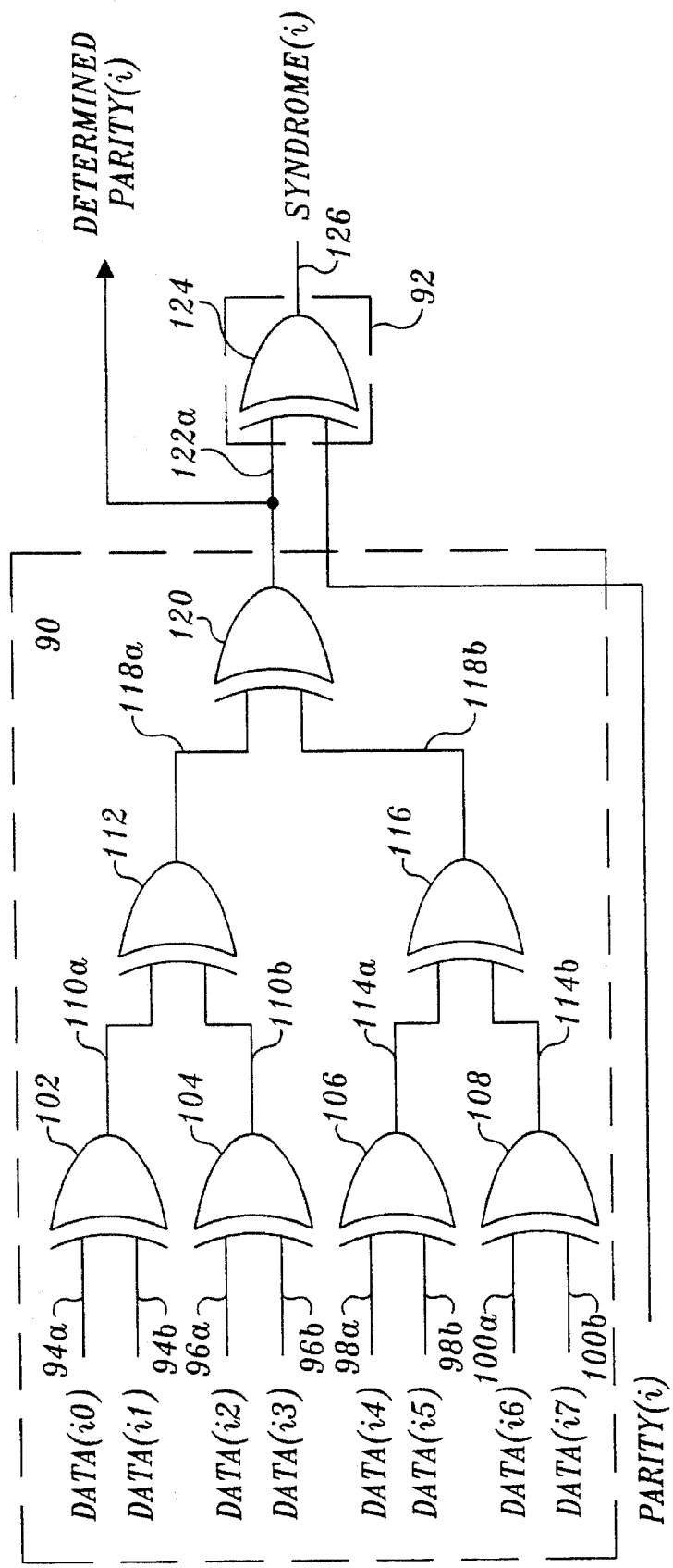
FIG. 3 is a bit slice of a parity generator and syndrome generator of the prior art EDAC circuit of FIG. 2.

As noted above, PG/SG section 52 comprises linear bit-sliced circuitry. The parity generator block and the syndrome generator block each comprise six bit slices, each bit slice corresponding to one parity bit and one syndrome bit, respectively. FIG. 3 illustrates a single such bit slice for each block, i.e., for the $i_{th}$ parity bit and the $i_{th}$ syndrome bit. A bit slice 90 of parity generator block 56 is shown that comprises four exclusive-OR gates 102, 104, 106, and 108. Pairs of data lines 94a and 94b are applied to the inputs of exclusive-OR gate 102. Similarly, pairs of data lines 96a and 96b, 98a and 98b, and 100a and 100b are applied to the inputs of the other three exclusive-OR gates 104, 106, and 108, respectively. The outputs of exclusive-OR gates 102 and 104 are applied through lines 110a and 110b, respectively, to the inputs of an exclusive-OR gate 112. Similarly, the outputs of exclusive-OR gates 106 and 108 are applied through lines 114a and 114b, respectively, to the inputs of an exclusive-OR gate 116. The outputs of exclusive-OR gates 112 and 116 are then applied through lines 118a and 118b, respectively to the inputs of an exclusive-OR gate 120, producing the $i_{th}$ parity bit for the eight data bits applied as an input to parity bit slice 90.

A syndrome bit slice 92 includes an exclusive-OR gate 124, having one input through line 122a from the output of exclusive-OR gate 120, and a second input 122b comprising the previously generated (and stored in memory) $i_{th}$ parity bit. Exclusive-OR gate 124 produces the $i_{th}$ syndrome bit on a line 126, and this bit is equal to a binary zero if the previously stored parity bit and the parity just determined by bit slice 90 are the same, or a binary one if one and only one of the two parity bit inputs is equal to a binary one. Five other parity bit slices just like parity bit slice 90 and five other syndrome bit slices just like syndrome bit slice 92 thus respectively comprise PG/SG section 52.

Figure 4:
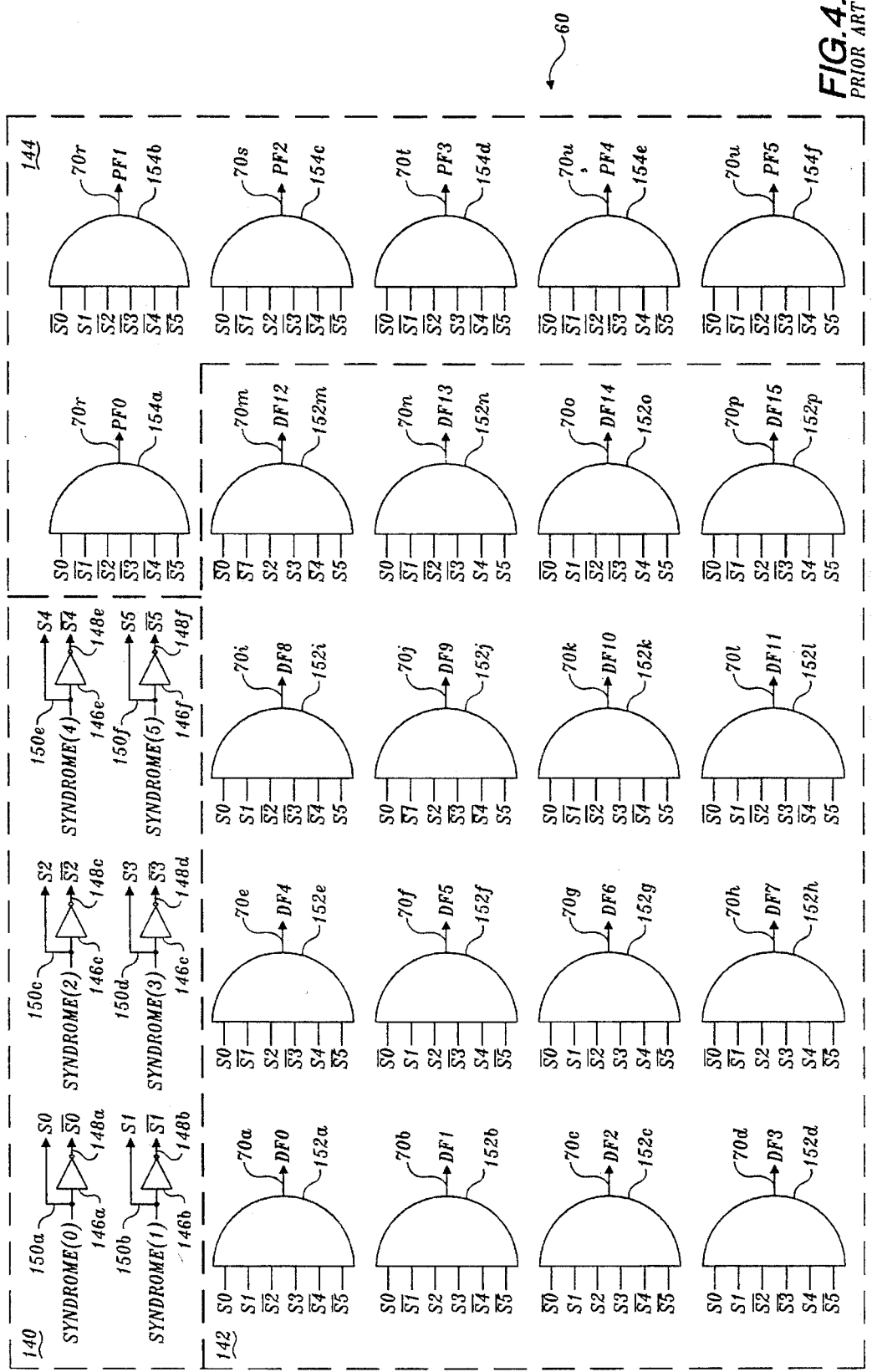
FIG. 4 is a functional block diagram of a syndrome decoder used in the prior art EDAC.

In contrast to the linear, bit-slice circuity of PG/SG section 52, SD/DC section 54 includes non-linear circuitry that is not defined by bit slices. The components comprising syndrome decoder block 60 are schematically illustrated in FIG. 4. Syndrome decoder block 60 includes an inverter circuit 140 that produces pairs of syndrome bits, each pair comprising the inverted form of the other syndrome bit. Thus, for example, syndrome bit (0) is applied to an inverter 146a, producing a signal $\overline{S0}$. The non-inverted bit appears as a signal S0 on a line 150a. Similarly, each of the other five syndrome bits are represented by S1 through S5, along with their inverted forms $\overline{S1}$ through $\overline{S5}$, which are output by inverters 146b through 146f. The non-inverted syndrome bits are conveyed on lines 150a through 150f, while the inverted signals are conveyed on lines 148a through 148f. These plural two pairs of signals S0 through S5 and their inverted forms $\overline{S0}$ through $\overline{S5}$ are used in producing a decoded syndrome signal that is applied to data corrector block 62.

Syndrome decoder block 60 also includes a data section 142 and a parity section 144. Data section 142 includes a plurality of six input AND gates 152a through 152p, to which are applied predetermined syndrome bits or their inverted forms, as shown in FIG. 4. Similarly, parity section 144 includes a plurality of six input AND gates 154a through 154f, to which are applied predetermined syndrome bits or their inverted forms, also as shown in this Figure. The outputs of AND gates 152 are provided over lines 70a through 70p, each providing a data flip (DFi) signal indicating whether or not one of the 16 data bits needs to be corrected (or flipped) by data corrector block 62. For example, AND gate 152a produces a data flip signal on line 70a that corresponds either to binary zero or a binary one.

If this signal, DF0, is a binary one, it indicates that data bit 0 must be flipped or changed to the opposite binary state by data corrector block 62 to represent a correct value. Similarly, each of the other output lines 70 define a specific data flip indication corresponding to one of the other binary data bits, indicating whether that particular bit requires correction.

In the same fashion, AND gates 154 produce parity flip signals PF0 through PF5, which indicate whether or not the corresponding parity bit 0 through 5 require correction by data corrector block 62. These parity flip (PFi) signals, which are present on the outputs of AND gates 154a through 154f on lines 70q through 70v have a value equal to binary one if correction of the corresponding parity bit is required, and a binary zero if not. The specific syndrome bits and their inverse forms used as inputs to each of the AND gates within data section 142 and parity section 144 are selected in the design of the EDAC to decode the syndrome bits so that the data or parity bits in which an error has occurred can be identified. It will be apparent to those of ordinary skill in the art that different types of EDACs use a different syndrome code to achieve this result, so that the details shown in FIG. 4 are specific only for one type of EDAC.

Figure 5:
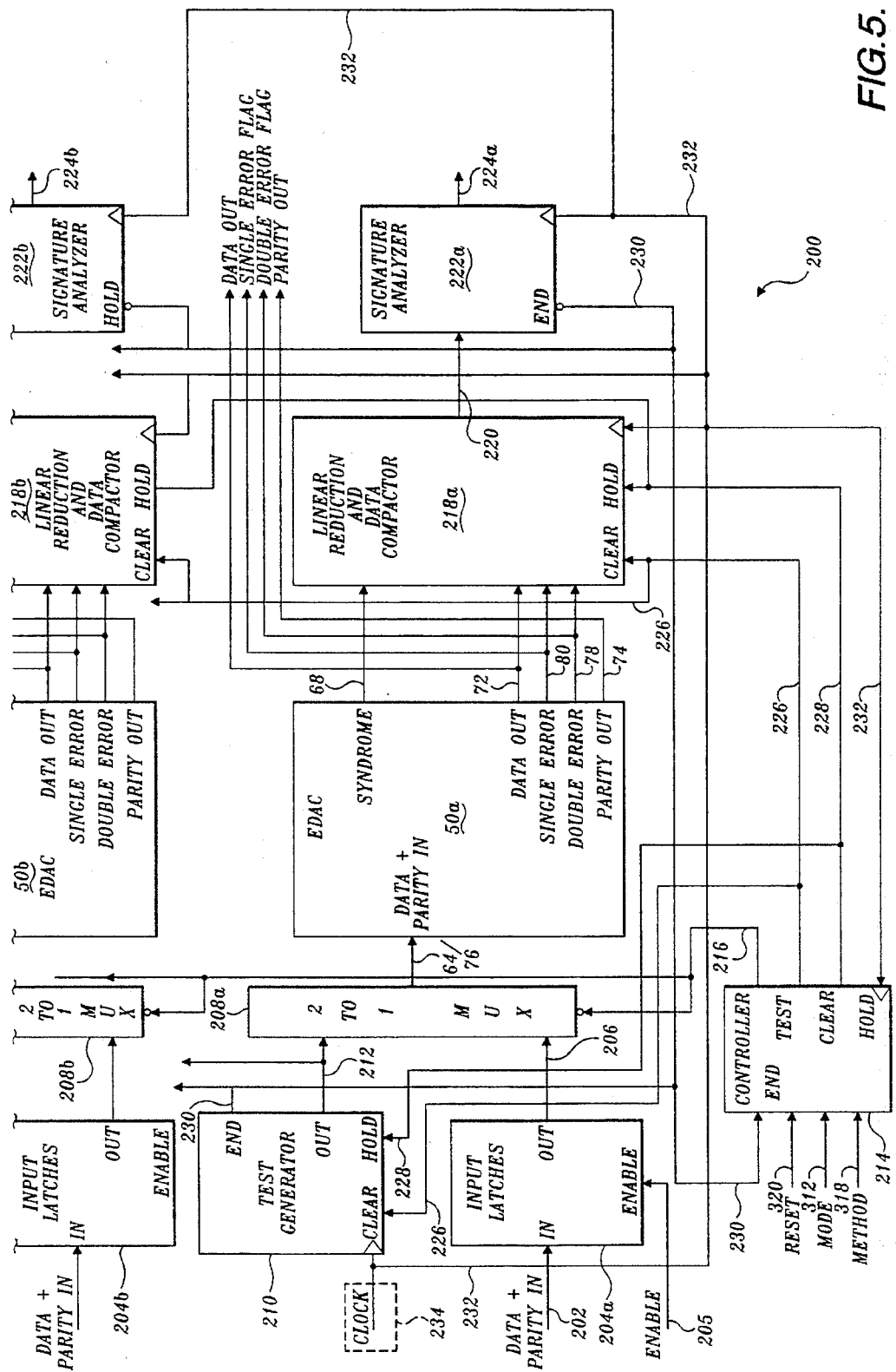
FIG. 5 is a schematic block diagram of an integrated circuit comprising a plurality of EDACs and a built-in self-test circuit in accordance with the present invention.

In the preferred embodiment of the present invention, an integrated circuit 200, shown in FIG. 5, includes a plurality of EDACs like that disclosed above. Although integrated circuit 200 might include only a single such EDAC 50, it is more economical to apply the present invention to testing a plurality of EDACs. An EDAC 50a is fully shown in the Figure, but only a portion of a second EDAC 50b is shown, and other EDACs included in integrated circuit 200 are not shown in order to simplify the drawing. Accordingly, it should be understood that the following disclosure, which for the most part relates specifically to self testing EDAC 50a, also applies to self testing the other EDACs comprising integrated circuit 200.

Each EDAC 50 in this integrated circuit includes input lines 64/76 for data and parity signals as described above. However, data and parity signals are externally input to integrated circuit 200 for each EDAC 50 over lines 202. Instead of being applied directly to one of the EDACs 50, the data and parity signals are applied to corresponding input latches, e.g., to input latches 204a in respect to EDAC 50a. Input latches 204a latch the binary bits comprising data and parity signals until receiving an enable signal over a line 205 (from an external function controller that is not shown). Upon receipt of the enable signal, input latches 204a transfer the data and parity bits over lines 206 to a two-to-one multiplexer 208a. When operating in a "normal mode," the data and parity bits are passed by multiplexer 208a through lines 64/76 to EDAC 50a for processing as described above. However, multiplexer 208a is also connected to receive test data from a test generator 210 over lines 212. A controller 214 on integrated circuit 200 determines the type of data output by multiplexer 208a, i.e., when controller 214 selects operation in the normal mode, a normal input signal comprising data and parity bits from input latches 204a, or, the test data when the controller selects operation in a "test mode."

To save space on integrated circuit 200, test generator 210 supplies test data for all of the EDACs 50. Each EDAC 50 in integrated circuit 200 receives its own data and parity information from input latches 204 when operating in the normal mode. Similarly, each EDAC 50 includes its own multiplexer 208 to select either the normal input signal or the test data signal for application to the EDAC, in response to controller 214. Controller 214 provides a test signal that controls multiplexers 208 over lines 216.

As previously described, each EDAC 50 within integrated circuit 200 includes data out lines 72, parity out lines 74, single error signal line 80, and double error line 78. Each of these lines are thus provided as outputs of integrated circuit 200 for each EDAC 50. However, the data out, single error signal, and double error signal from EDAC 50a are also applied to the input of a linear reduction and data compactor 218a. Furthermore, lines 68 convey the syndrome bits as an input to linear reduction and data compactor 218a. At the end of a complete self test, the output of the linear reduction and data compactor comprises a test signature, which is applied through lines 220 to an input of a signature analyzer 222a. Signature analyzer 222a in one form of the preferred embodiment compares the test signature for EDAC 50a to a predetermined expected signature and if the two are the same, provides an indication of "no fault" on a line 224a. Conversely, if the test signature differs from the predetermined expected signature, signature analyzer 222a produces an indication that a fault was detected in EDAC 50a. In this form of the embodiment, a linear reduction and data compactor 218b similarly develops a test signature for EDAC 50b which is applied to a signature analyzer 222b for comparison against the expected signature. Depending upon the results of that comparison, the signal on line 224b indicates either that no fault was detected or that EDAC 50b was found to have a fault during the self test. Each of the EDACs 50 within integrated circuit 200 are thus separately tested using test generator 210 to produce the common test data so that a separate test result is developed and output over lines 224 for each EDAC in integrated circuit 200.

In another form of the preferred embodiment of integrated circuit 200, which is not specifically shown in FIG. 5, each EDAC 50 is connected to a single linear reduction and data compactor 218 that produces an overall test signature for all of the EDACs on the integrated circuit. At the end of a self-test cycle, the test signature is then compared against the predetermined expected signature by signature analyzer 222a. Generally, the same self-test method is used, regardless of whether a separate linear reduction and data compactor 218 and separate signature analyzer 222 are provided for each EDAC, or whether a single linear reduction and data compactor and signature analyzer are provided for all of the EDACs undergoing self test.

A complete self test of each EDAC 50 requires that each of the nodes within the EDAC be toggled back and forth (as least once) between the two binary states, 0 and 1, without latching or "sticking" in one of the states. In this respect, each node within the EDAC comprises an input and/or output of each gate within the EDAC. In EDAC 50 as described above, approximately 230 test vectors produced by test generator 210 are required to substantially fully test and toggle the binary states of all the nodes within the EDAC. Linear reduction and data compactor 218a receives the syndrome, data out, single error, and double error signals that result from the application of each test vector to EDAC 50a. For each successive test vector, the signature previously developed by linear reduction and data compactor 218a is exclusively OR-ed with the syndrome, data out, single error and double error signals (following a linear reduction of the number of bits in the syndromes and data) to produce a new signature. At the conclusion of the self test, when all of the test vectors have been applied and have propagated through EDAC 50, a final test signature is output to signal analyzer 222a that is then compared against the predetermined expected signature.

Test generator 210 defines the end of a self test, i.e., an indication that the last of the test vectors has been applied to EDAC 50 by producing an end-of-test signal that is applied to a line 230, which is connected to controller 214 and to signature analyzer 222a. The signature analyzer then responds by making the comparison of the test signature with the predetermined expected signature. Controller 214 also responds to the end-of-test signal by producing a clear signal that is conveyed over lines 226 to linear reduction and data compactor 218. In the event that a self test is interrupted, as may occur when running in a pseudo-concurrent mode, controller 214 produces a hold signal that is applied to test generator 210 and to linear reduction and data compactor 218a, thereby interrupting the output of the self-test data signal and causing; the existing signature developed by linear reduction and data compactor 218 to be held until the self test resumes.

Integrated circuit 200 clearly benefits from using a single test generator 210 to generate the test data used to self test each of the EDACs 50 due to the reduced component count required for the self-test capability. Further advantages are not evident from FIG. 5, since they relate to the nature of the test data applied to self test each of the EDACs. The specific test data used, of course, depends upon the particular device being tested, and in the following discussion is described in respect to the specific EDAC 50 already disclosed. One of the advantages of the present invention is its ability to substantially completely self test devices on an integrated circuit, such as EDACs 50, using relatively few test vectors, and using test data produced by test generator 210 that includes fewer bits than found in the normal input signal for that device. As explained previously, EDAC 50 is designed for six parity bits and 16 data bits. The parity bits developed by each of the six bit slices as exemplarily shown in FIG. 3 are developed by exclusive OR-ing of specified data bits in parity generator block 56. Table 1 defines the selected data bits used to generate parity bits P0 through P5 in EDAC 50. These parity bits are generated by the addition of the selected data bits in base 2, as provided in each parity bit slice 90.

TABLE 1

P0 = D0 + D1 + D3 + D4 + D8 + D9 + D10 + D13
P1 = D0 + D2 + D3 + D5 + D6 + D8 + D11 + D14
P2 = D1 + D2 + D4 + D5 + D7 + D9 + D12 + D15
P3 = D0 + D1 + D2 + D6 + D7 + D10 + D11 + D12
P4 = D3 + D4 + D5 + D6 + D7 + D13 + D14 + D15
P5 = D8 + D9 + D10 + D11 + D12 + D13 + D14 + D15

To generate the six syndrome bits, the previously generated (and stored) parity bits are added in base 2 to the selected data bits that were previously used to generate the parity bits, as shown in Table 2.

TABLE 2

S0 = P0 + D0 + D1 + D3 + D4 + D8 + D9 + D10 + D13
S1 = P1 + D0 + D2 + D3 + D5 + D6 + D8 + D11 + D14
S2 = P2 + D1 + D2 + D4 + D5 + D7 + D9 + D12 + D15
S3 = P3 + D0 + D1 + D2 + D6 + D7 + D10 + D11 + D12
S4 = P4 + D3 + D4 + D5 + D6 + D7 + D13 + D14 + D15
S5 = P5 + D8 + D9 + D10 + D11 + D12 + D13 + D14 + D15

A complete test of one parity bit slice 90 and one syndrome bit slice 92 requires that a minimum set of test vectors be applied at the inputs of exclusive-OR gates 102 through 108 in each of the parity bit slices 90. The minimum set of test vectors are shown in Table 3.

TABLE 3

| DATA | PARITY |
|---|---|
| 0 0 0 0 0 0 0 0 | 0 |
| 1 1 1 1 1 1 1 1 | 1 |
| 1 0 1 0 1 0 1 0 | 1 |
| 1 0 0 0 1 0 0 0 | 1 |
| 1 0 0 0 0 0 0 0 | 1 |

In order for every self test in the set of test vectors shown in Table 3 to reach each of the six bit slices 90 comprising the parity generator block 56 and the six bit slices 92 comprising the syndrome generator block 58, the test vectors must be expanded to six different tests according to the definition of the syndromes presented in Table 2. For example, a test vector 101010101 will reach the S0-bit slice if the test 10X10XXX101XXOXX (data) and 1XXXXX (parity) are applied to the data and parity inputs respectively (where X represents a "don't care" bit). Accordingly, the first step in determining the appropriate test data to apply to completely test parity generator block 56 and syndrome generator block 58 (as shown in FIG. 2) is to express all such expanded test vectors.

A test matrix that includes B * S rows and D+S columns (where D is the number of data bits, S is the number of syndrome bits, and B is the number of bit slice test vectors) is formed so that the rows of the test matrix represent the expanded bit slice tests. In forming the test matrix, a "set" test vector comprising all (22) binary ones and a "reset" vector comprising all (22) binary zeroes need not be included, since one-time set and reset signals from test generator 210 will serve to provide these test vectors to all bit slices simultaneously, regardless of the code employed by the EDAC. Since there is no code dependence for set and reset used by any EDAC, there is no reason to complicate the problem by including these two test vectors in the test matrix. Table 4 thus represents the test matrix of the required test vectors to completely test parity generator block 56 and syndrome generator block 58 by toggling all modes contained therein back and forth (at least once) between the two binary states zero and one.

TABLE 4

| DATA (D0–D15) | PARITY (P0–P5) |
|---|---|
| 1 0 X 1 0 X X X 1 0 1 X X 0 X X | 1 X X X X X |
| 1 X 0 1 X 0 1 X 0 X X 1 X X 0 X | X 1 X X X X |
| X 1 0 X 1 0 X 1 X 0 X X 1 X X 0 | X X 1 X X X |
| 1 0 1 X X X 0 1 X X 0 1 0 X X X | X X X 1 X X |
| X X X 1 0 1 0 1 X X X X 0 1 0 | X X X X 1 X |
| X X X X X X X X 1 0 1 0 1 0 1 0 | X X X X X 1 |
| 1 0 X 0 0 X X X 1 0 0 X X 0 X X | 1 X X X X X |
| 1 X 0 0 X 0 1 X 0 X X 0 X X 0 X | X 1 X X X X |
| X 1 0 X 0 0 X 1 X 0 X X 0 X X 0 | X X 1 X X X |
| 1 0 0 X X X 0 1 X X 0 0 0 X X X | X X X 1 X X |
| X X X 1 0 0 0 1 X X X X X 0 0 0 | X X X X 1 X |
| X X X X X X X X 1 0 0 0 1 0 0 0 | X X X X X 1 |
| 1 0 X 0 0 X X X 0 0 0 X X 0 X X | 1 X X X X X |
| 1 X 0 0 X 0 0 X 0 X X 0 X X 0 X | X 1 X X X X |
| X 1 0 X 0 0 X 0 X 0 X X 0 X X 0 | X X 1 X X X |
| 1 0 0 X X X 0 0 X X 0 0 0 X X X | X X X 1 X X |
| X X X 1 0 0 0 0 X X X X X 0 0 0 | X X X X 1 X |
| X X X X X X X X 1 0 0 0 0 0 0 0 | X X X X X 1 |

In Table 4, X's again are used to denote the "don't care" bits in the test vectors. It is apparent that many of the test vectors include a substantial number of "don't care" bits. Consequently, the present invention provides for compaction of the test vectors in order to find a minimal set of test vectors necessary for fully testing the parity generator block and syndrome generator block. The test vectors shown in Table 4 can be compacted such that required test bits of one vector fit into "don't care" bits of another test vector. In a simplistic example, if one vector comprises 1X0X1XX and a second vector comprises X101X11, the two vectors can clearly be compacted to form a single vector 1101111. Various compaction techniques are available for this purpose, and a preferred algorithm for compacting the test vectors is presented below.

Following the compaction of the test vectors shown in Table 4, a new compacted test matrix is produced, as shown in Table 5, which includes eight rows and 22 columns.

TABLE 5

| DATA (D0–D15) | PARITY (P0–P5) |
|---|---|
| 1 0 X 1 0 1 0 1 1 0 1 0 1 0 1 0 | 1 X X X 1 1 |
| 1 1 0 1 1 0 1 1 0 0 X 1 1 X 0 0 | X 1 1 X X X |
| 1 0 1 X X X 0 1 X X 0 1 0 X X X | X X X X 1 X |
| 1 0 0 0 0 X 0 1 1 0 0 0 0 0 X X | 1 X X 1 X X |
| 1 1 0 0 0 0 1 1 0 0 X 0 0 X 0 0 | X 1 1 X X X |
| X X X 1 0 0 0 1 1 0 0 0 1 0 0 0 | X X X X 1 1 |
| 1 0 0 0 0 0 0 0 0 0 0 0 0 0 0 X | 1 1 X 1 X X |
| X 1 0 1 0 0 0 0 1 0 0 0 0 0 0 0 | X X 1 X 1 1 |

It is apparent that a significant number of "don't cares" still exist within the compacted test vectors shown in Table 5. Every one of the 22 columns within the compacted test matrix of Table 5 corresponds to a separate bit that apparently must be produced by test generator 210, implying that it must provide 22-bit long test vectors. To minimize the requirement for the number of bits that test generator 210 must provide for each test vector, a second compaction of the column vectors in Table 5 is done, merging all input data bits that can come from the same source. The number of columns remaining after the second compaction thus represents the length of the bit pattern for each test vector that test generator 210 must provide to generate a complete test of the parity generator block and syndrome generator block. Table 6 illustrates the merged column vectors following the second compaction, wherein the bits $t_0$–$t_{10}$ correspond to the bits of the test vectors that test generator 210 must provide. These 11 bits are fanned out to the indicated data bits and parity bits (totaling 22), for input to EDACs 50. By compacting the 22 columns of Table 5, requirements for the test generator bit pattern have thus been reduced to 11. As a result, a substantially smaller test generator can be used that produces substantially fewer bits than the number comprising the normal input signal to EDACs 50.

TABLE 6

Figure 6:
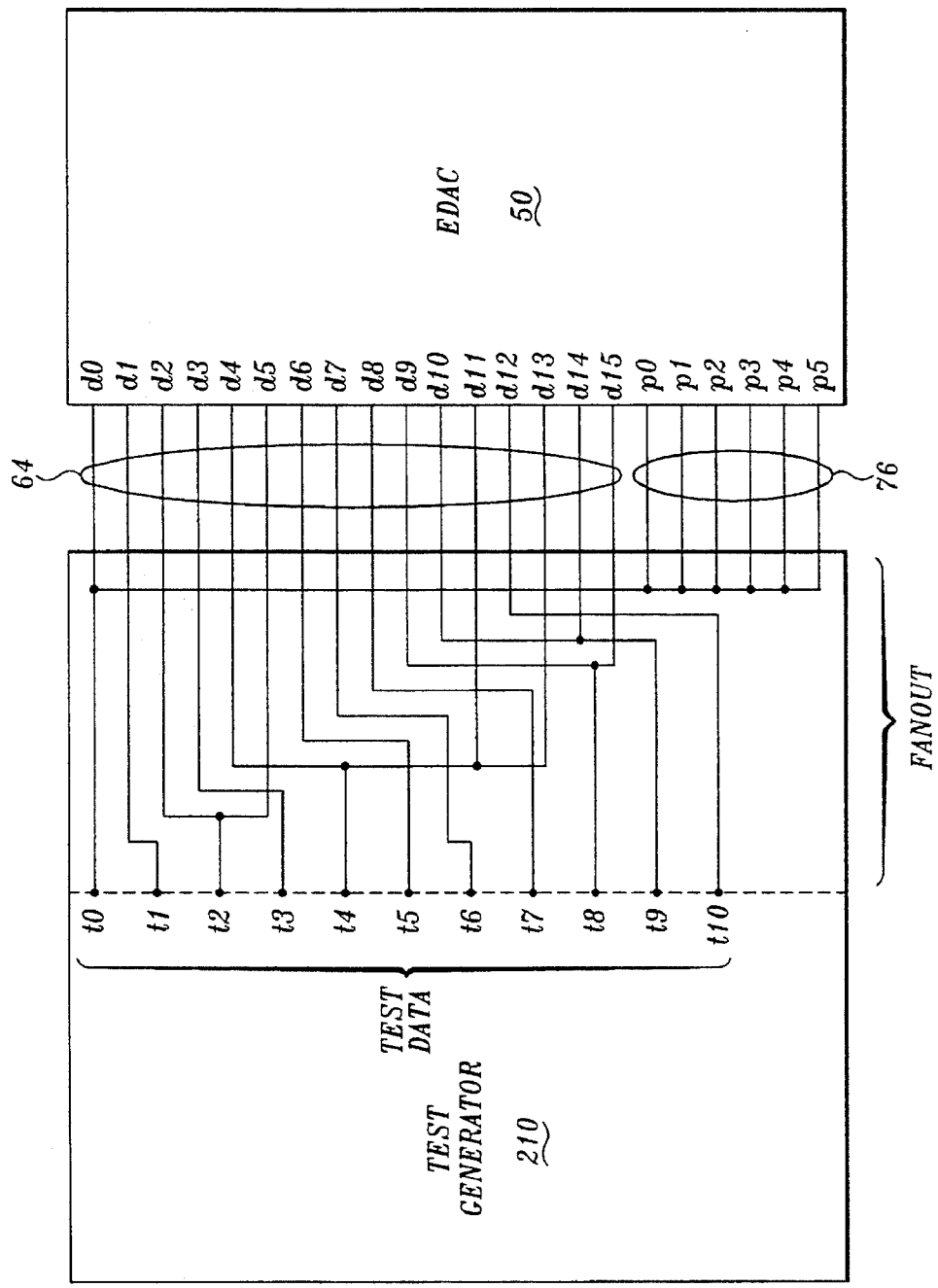
FIG. 6 is a schematic block diagram illustrating the test signal fan out for a (22,16) EDAC self testing in accordance with the preferred embodiment of FIG. 5.

(FANOUT in FIG. 6)

$t_0 \rightarrow$ D0, P0, P1, P2, P3, P4, P5
$t_1 \rightarrow$ D1
$t_2 \rightarrow$ D2, D5
$t_3 \rightarrow$ D3
$t_4 \rightarrow$ D4, D11, D13
$t_5 \rightarrow$ D6
$t_6 \rightarrow$ D7
$t_7 \rightarrow$ D8
$t_8 \rightarrow$ D9, D15
$t_9 \rightarrow$ D10, D14
$t_{10} \rightarrow$ D12

FIG. 6 schematically illustrates how the test bits $t_0$–$t_{10}$ produced by test generator 210 are fanned out to provide 16 bits on data input lines 64 of EDACs 50 and six bits on parity input lines 76. To simplify the illustration in FIG. 6, multiplexer 208 is omitted. The data and parity input to each EDAC in this Figure thus corresponds to the input that is provided through multiplexer 208 when the test mode is selected.

Figure 7:
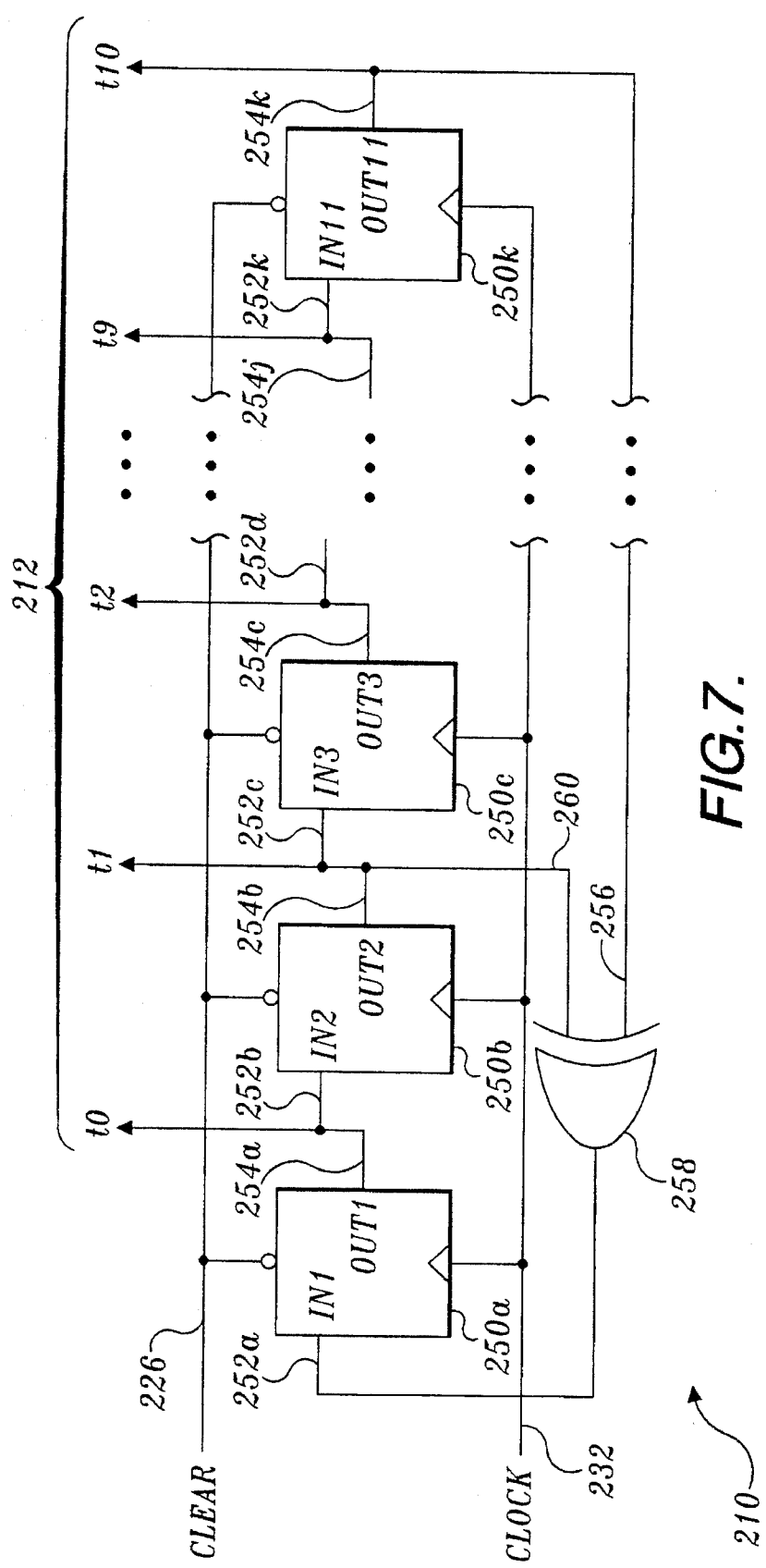
FIG. 7 is a schematic block diagram showing a portion of the linear feedback shift register used to generate the test signal used to self test the EDACs.

In the preferred form of the present invention, test generator 210 comprises a maximal length linear feedback shift register as shown in FIG. 7. It should be apparent to those of ordinary skill in the art that the number of bits produced by the linear feedback shift register comprising test generator 210 depend upon the particular requirements of the EDAC (or other device)undergoing test, and the degree of compaction of the test vectors that can be achieved for such tests. The feedback shift register shown in FIG. 7 produces 11 output bits, $t_0$–$t_{10}$; it includes a plurality of bit shift cells 250a–250k, each having an input and an output, and each connected to lines 226 to receive the clear signal and to lines 232 to receive a clock signal. Input lines 252a–252k are connected to the input of each bit shift cell 250, and output lines 254a–254k connect to the respective outputs of the bit shift cells. Accordingly, bits $t_i$ are provided on output lines 254a–254k. A line 256 connects the output of bit shift cell 250b, corresponding to bit $t_1$, to one input of an exclusive-OR gate 258, the other input being connected through a line 260 to the output of bit shift cell 250k, which provides bit $t_{10}$. The output of exclusive-OR gate 258 feeds back to the input of shift bit cell 250a on line 252a. With each clock cycle on line 232, the bit shift cells each transfer the bit on their input to their output. The particular feedback bits selected for input to exclusive-OR gate 258 ensure that a pseudo-random bit pattern is generated for bits $t_i$, with a maximum number of bit patterns being generated before bit pattern repeats. Linear feedback shift registers, as shown in FIG. 7, are well known to those skilled in the art and represent a relatively simple device for generating the test vectors required for the built-in self test of EDACs 50. Various other types of linear feedback shift registers having the required number of output bits, but using different feedback configurations may also be used for this purpose.

As noted above, the predefined fanout of bits $t_i$ shown in FIG. 6 and defined in Table 6 provides for a complete test of PG/SG section 52 of each of the EDACs 50. However, self test of the syndrome decoder block 60 and data corrector block 62 have not been addressed-do these test vectors also provide a complete test of SD/DC section 54? The fanout illustrated in FIG. 6 effectively maps the test generator output to a much larger space comprising $2^{(D+S)}$ test vectors; however, the EDAC 50 code implemented by the parity generator block and syndrome generator block in turn maps this vector space into a much smaller space of the syndrome vectors. The product of these mathematical mapping operations acting on the initial set of test vectors is not always capable of generating all combinations of $2^S$ syndromes. Due to its non-linearity, syndrome decoder block 60 is very particular about the test vectors required to fully test it. If one of the syndrome vectors omitted from the mapping operations happens to coincide with one needed by the syndrome decoder block and the data corrector block, incomplete fault detection occurs. In the preceding example, the mapping operations applied to the test data results in the following syndromes as a function of the bits $t_i$ that are provided by test generator 210:

TABLE 7

$S0 = t_1 + t_3 + t_7 + t_8 + t_9$
$S1 = t_3 + t_4 + t_5 + t_7 + t_9$
$S2 = t_0 + t_1 + t_4 + t_6 + t_{10}$
$S3 = t_1 + t_2 + t_4 + t_5 + t_6 + t_9 + t_{10}$

TABLE 7-continued $S4 = t_0 + t_2 + t_3 + t_5 + t_6 + t_8 + t_9 + t_{10}$
$S5 = t_0 + t_7 + t_{10}$ The syndrome equations shown above in Table 7 are linearly independent. Therefore, all syndromes will be applied to the syndrome decoder block 60, provided there are a sufficient variety of test vectors applied to the parity and syndrome generator blocks 50 and 58. Accordingly, the test vectors defined by the fanout shown in Table 6 represent 100% fault coverage for syndrome decoder block 60 and data corrector block 62. In certain devices, this is not necessarily true. For example, in a (39,32) EDAC that is normally provided with 32 bits of data and seven bits of parity, a compaction of the test data signal generally in accordance with the technique described above defines a requirement for a test generator that produces 17 bits, $t_0$–$t_{16}$, that are used to form seven syndrome equations, i.e., the test vectors are 17 bits long. In this case, the syndrome equations do not satisfy linear independence, thereby indicating incomplete fault coverage. To overcome this problem, greater variability is required in the test vectors. In the preceding example, the parity input in each bit slice test shown in Table 3 is the same, except for the reset vector, which has all zero bits. Since this reset vector has not been included in the compaction process, the second compaction always merges all the parity inputs together (note the fanout of $t_0$) as shown in Table 6. To eliminate linear dependencies and increase fault coverage, the parity bit in syndrome equation S1 can be provided from a different test bit, $t_1$, instead of $t_0$. This simple change readily eliminates all linear dependencies, providing for 100% fault coverage of the syndrome decoder block and data corrector block in the (39,32) EDAC.

The total number of pseudo-random bit patterns (test vectors) that must be generated by test generator 210 to complete a substantially 100% fault coverage of EDAC 50 is empirically determined. The test generator is reset and allowed to run until it is determined that all nodes within EDAC 50 have been toggled back and forth at least once between zero and one. As noted above, approximately 230 test vectors are applied to EDACs 50 to complete a 100% fault coverage test. Clearly this number is dependent upon the specific type of EDAC under test, and the linear feedback shift register comprising test generator 210. At the end of the full test, as determined by a clock counter or bit pattern comparator (neither shown), test generator 210 produces an end-of-test signal. In response, controller 214 (shown in FIG. 5) produces a clear signal over lines 226 that resets the linear feedback shift register comprising test generator 210 in preparation for running the next built-in self test cycle. Accordingly, test generator 210 produces the same series of test vectors each time that a self test is run to completion. The same test vectors must be applied to EDAC 50a to ensure that the test signature generated by the linear reduction and data compactor is the same as the expected signature (assuming that no faults are detected within EDAC 50a).

Figure 8:
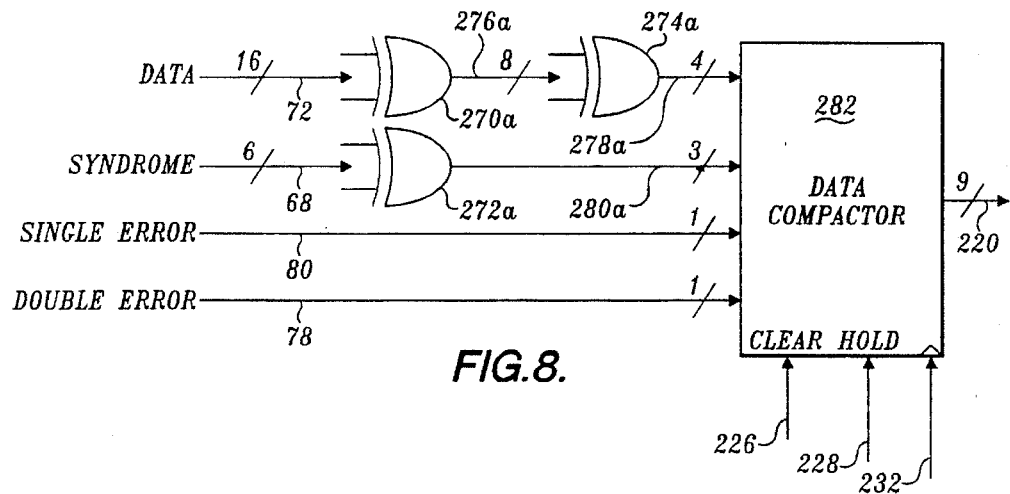
FIG. 8 is a schematic representation of the linear data reduction circuit that is used to reduce the number of bits in the output signal of the EDACs before a test signature is determined.

Linear reduction and data compactor 218 forms a test signature at the end of a full test using the syndromes produced by the PG/SG section 52, the data output, and the error signals produced by SD/DC section 54. Together, all of the signals input to linear reduction and data compactor 218a comprise a total of 24 bits. To reduce the overhead associated with the data compaction used in forming a test signature, the total number of bits in these input signals are linearly reduced, generally as shown in FIG. 8. In this process, eight exclusive-OR gates 270 are connected to receive the 16 bits of output data. For example, as shown in the Figure, exclusive-OR gate 270a is connected to receive data bits D0 and D1, producing an output on a line 276a. Similarly, seven other exclusive-OR gates (not specifically shown) are connected to receive each of the other successive data bits D2–D15 (taken two at a time), each exclusive-OR gate producing an output that is connected to one of two inputs of four exclusive-OR gates 274. Exclusive-OR gates 274 are connected to successive pairs of the outputs of exclusive-OR gates 270 and produce 4 bits of data on lines 278, which are input to a data compactor circuit 282.

In a similar manner, the six syndrome bits are connected two at a time to exclusive-OR gates 272, producing three syndrome bits that are applied over lines 280 to data compactor circuit 282. Of the three exclusive-OR gates 272, only exclusive-OR gate 272a is shown in the Figure, connected to a line 280a. Data compactor circuit 282 receives the single error signal and the double error signal on lines 80 and 78, respectively. Thus, the exclusive-OR gates 270, 272, and 274 linearly reduce the 16 bits of data and six bits of syndrome bits to four data bits and three syndrome bits, for a total input to data compactor circuit 282 of only nine bits.

Figure 9:
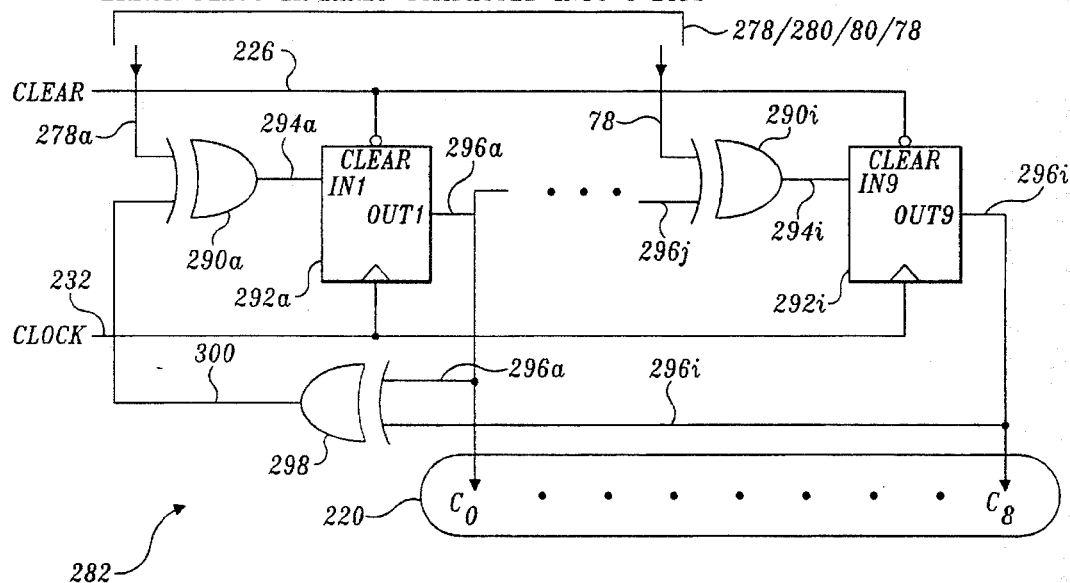
FIG. 9 is schematic block diagram of a portion of the signature analyzer that produces the test signature.

Referring to FIG. 9, data compactor circuit 282 is connected to the four data bit lines, of which only line 278a is shown, the three syndrome lines, (not shown) and the error signal lines, of which only double error line 78 is shown. The nine bits of input for data compactor 282 are each applied to one input of a different one of exclusive-OR gates 290a–290i. For example, data line 278a is applied to one input of exclusive-OR gate 290a, the other input being connected through a line 300 to an output of an exclusive-OR gate 298. The output of exclusive-OR gate 290a is connected through a line 294a to one input of a bit shift cell 292a, having an input and an output, a clear terminal connected to line 226, and a clock terminal connected to line 232. The output of bit shift cell 292a is connected through a line 296a to the input of exclusive-OR gate 298. The output of bit shift cell 292a is identified by C0 and is the first bit of a signature. Line 296a connects to the input of the next exclusive-OR gate (would be reference numeral 290b if shown), which has an output connected to the next bit shift cell, and so forth, through successive bits of the 9-bit input signal. Finally, the ninth input bit, corresponding to the double error signal, which is conveyed on double error line 78, is applied to one input of exclusive-OR gate 290i, the other input receiving the output of a preceding bit shift cell (not shown). Exclusive-OR gate 290i produces an output signal that is applied through a line 294i to the input of bit shift cell 292i, which has an output connected to line 296i. This output corresponds to the ninth bit of the signature, C8, and is also connected to one of the inputs of exclusive-OR gate 298.

As each of the successive test vectors produce corresponding data out, syndromes, and single and double error signals, the resulting input to data compactor circuit 282 is exclusively OR-ed with the signature developed from the test vectors already applied to EDAC 50a. After the last test vector produces its corresponding data output, syndromes, etc., the final exclusive-OR operation in data compactor circuit 282 produces a test signature that is conveyed through lines 220 to signature analyzer 222a, for comparison with the predetermined expected signature that is stored therein. Although not shown, the signature analyzer simply comprises a plurality of exclusive-OR gates to which the corresponding bits of the test signature and the predetermined expected signature are applied in bit pairs and then linearly reduced; if any bit of the test signature differs from any bit of the predetermined expected signature, the output of signature analyzer 222a is a binary one and otherwise, is a binary zero.

Referring back to FIG. 5, the clock signal conveyed over line 232 is optionally provided by a clock 234 that is included on integrated circuit 200. Alternatively, the clock signal can be provided by a remote system clock (not shown). During normal operation of EDACs 50, the data and parity input over lines 64/76 might be processed in less than a single clock cycle, leaving a remainder of the clock cycle free for self test of the EDACs. Accordingly, controller 214 is connected to receive a mode signal over a line 312 that is used to selectively cause controller 214 to initiate the self-test mode. The mode signal can initiate a self test upon receipt of a demand from an external source (such as CPU 22 in FIG. 1), or can initiate a self test each time integrated circuit 200 is initially energized.

In addition, a method signal is applied over a line 318 that is used to select between an on-demand and a pseudo-concurrent self-test mode. If the method signal comprises a binary one, the on-demand self-test mode is selected; conversely, if a binary zero method signal is applied over line 318, the pseudo-concurrent self-test mode is selected. Once the self-test mode is initiated by the mode signal applied on line 312, and assuming that the method signal has selected the on-demand self-test mode, the clear signal is provided over lines 226 by controller 214, enabling a self-test cycle to begin. At the end of the self-test cycle, and following comparison of the test signature with the expected test signature, the result of the comparison is output over line 224a, and the self-test cycle is repeated until the mode signal applied on line 312 is toggled, switching controller 214 out of the self-test mode.

Assuming that the pseudo-concurrent test mode is selected by the method signal, a portion of the self test is run at any time when the EDAC is not required to process the normal input, permitting as much as possible of the self-test cycle to be completed as a test sub-cycle before EDACs 50 are again required to process their normal input signals. These test sub-cycles can continue to run, interleaved with the normal signal processing, until one test cycle is completed, i.e., until all of the test vectors comprising a complete test of the EDACs 50 have been run. Reset of the self-test components, including test generator 210 and linear reduction and data compactor(s) 218, does not occur until the completion of a self-test cycle, even if interrupted to allow the EDACs to process their normal input signal.

Figure 10:
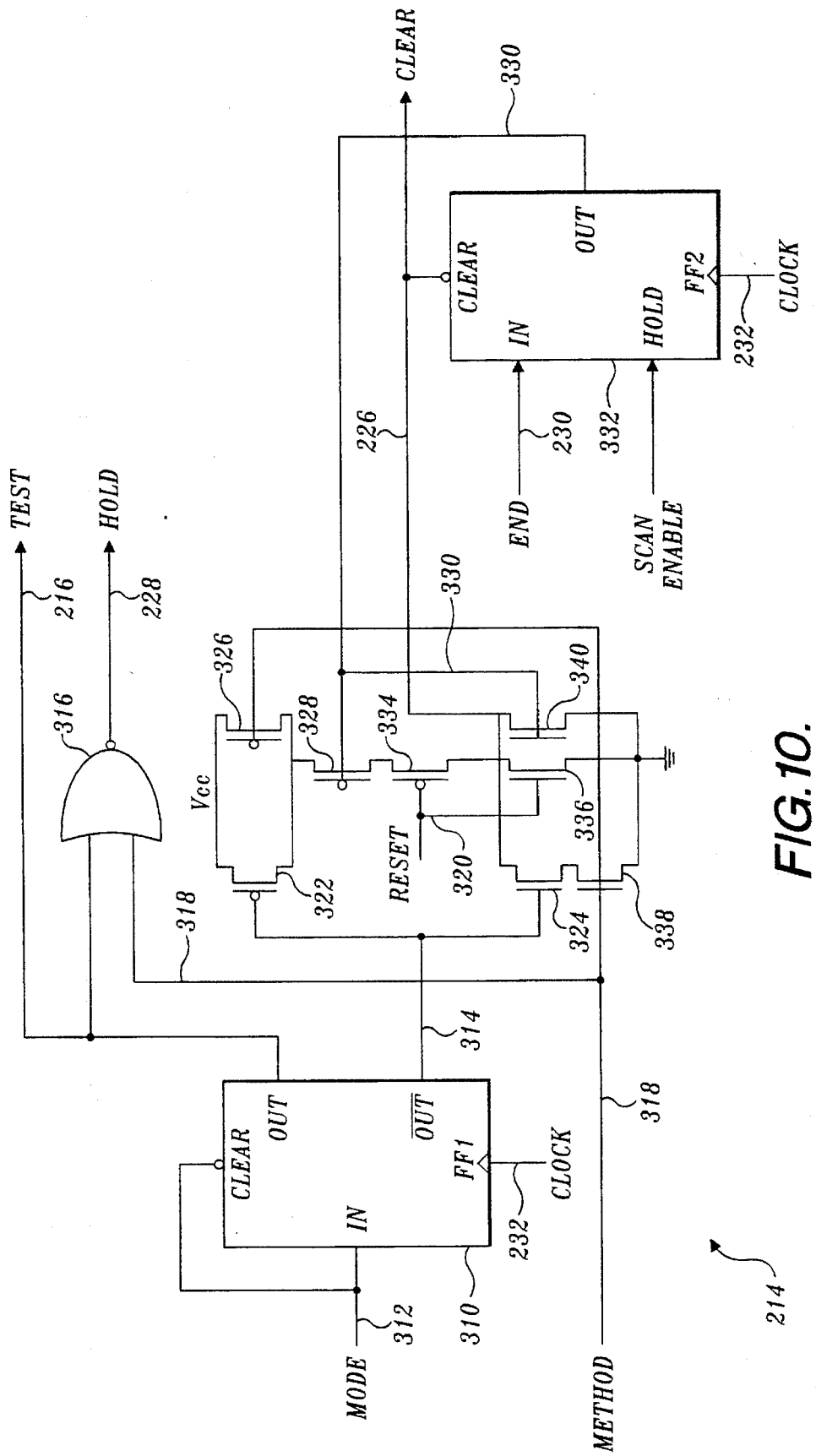
FIG. 10 schematically illustrates a controller for the self-test system.

As shown in FIG. 10, controller 214 includes a flip flop 310 having an input and a clear terminal connected to receive the mode signal applied via line 312. The test signal is generated at the output of flip flop 310 and conveyed over line 216, which is also connected to an input of a NOR gate 316. In addition, flip flop 310 includes an inverted output that is connected through a line 314 to a gate of a P-channel metal oxide semiconductor field effect transistor (PMOS FET) 322 and to a gate of an N-channel metal oxide semiconductor field effect transistor (NMOS FET) 324. Line 318 conveys the method signal to the other input of NOR gate 316, to the gate of an NMOS FET 338, and to the gate of a PMOS FET 326. A reset signal is conveyed over a line 320, to the gates of a PMOS FET 334 and an NMOS FET 336. Line 226, which conveys the clear signal, is connected to one side of an NMOS FET 340; the gate of this NMOS FET is connected in common with the gate of a PMOS FET 328 to the output of a flip flop 332. The input of flip flop 332 is connected via line 230 to receive the end-of-test signal; the clock signal is applied to the clock terminal of flip flop 332 over line 232.

At the conclusion of a test cycle, the end-of-test signal is applied to the input of flip flop 332 and causes the clear signal to be output over lines 226 to reset the self-test circuitry for another test cycle. When the method signal selects the pseudo-concurrent self-test mode, the test signal produced by controller 214 toggles multiplexers 208 to select the normal input signal when available, putting the self test on hold until EDACs 50 are again free to process the self-test data. Thus, by using cycle stealing, a portion of each clock cycle that is available after the normal test signal is processed is used to run sub-cycles of the self test until the next time the normal signal must be processed, or until the test cycle is complete.

Data Compaction Algorithm

Although other data compaction algorithms may be used, the preferred embodiment uses a method that was developed by Egon Bales and Chang Sung Yu, as defined in their paper "Finding a Maximum Clique in an Arbitrary Graph," Vol. 15, No. 4, November 1986, Society for Industrial and Applied Mathematics, pp. 1054–1068. As applied to the subject invention, a maximum clique corresponds to a set of compact test vectors. In the above-referenced paper, the algorithm is described in respect to finding a maximum clique in an arbitrary graph G=(V,E).

In the following description of this algorithm, each of the test vectors represented by a row in the matrix of Table 4 corresponds to a vertex or point in the graph G. "V" thus represents a set of such vertices. The binary compaction of the set of vertices represented by V is a problem of finding a minimal set of binary vectors that represent the larger set V of binary vectors. A basic rule followed by the algorithm is that two binary vectors $v_1$ and $v_2$ of length l can be compacted into one vector if and only if $v_1(i)$ equals a "don't care" bit, or $v_2(i)$ equals a "don't care" bit, or $v_1(i)$ equals $v_2(i)$ for all i=1 . . . l. In applying this algorithm, it is assumed there are N binary vectors of length l to compact.

The problem is to develop a graph G having N vertices such that every vertex in the graph represents one of the test vectors. An edge exists between two such vertices if the binary vectors represented by them can be compacted. A complete sub-graph of this graph is by definition, a set of vertices that are fully connected with edges, E, and the complete sub-graph is known as a clique. Therefore, a maximal clique is one that has the largest number of such vertices. Further, the vertices in a maximal clique thus found represent the largest number of vectors that can be compacted together. Every time a maximal clique is found, vectors corresponding to its vertices are compacted. Those vertices are then eliminated from the graph, and the process is repeated for the remaining vertices until there are no more vectors to compact. This algorithm does not guarantee to find the absolute minimum compaction of the vectors, since that is considered to be an NP-complete (non-polynomial complete) problem, which is solvable only in exponential time. The algorithm simply provides a time efficient way of finding a near optimal solution.

Figure 11:
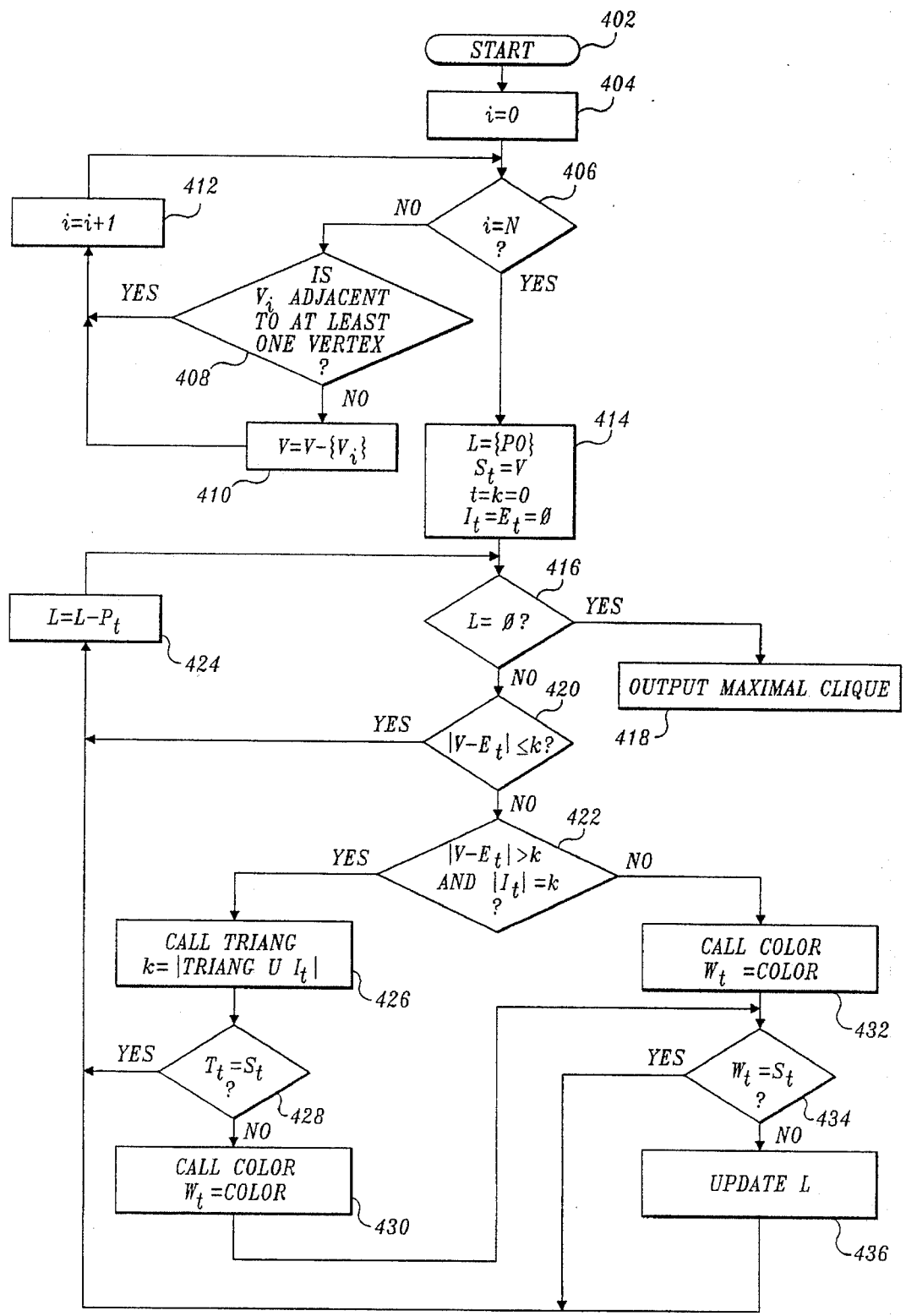
FIG. 11 is a flow chart showing the steps comprising the algorithm used in the preferred embodiment for compressing the test vectors used to test the EDACs.
Figure 12:
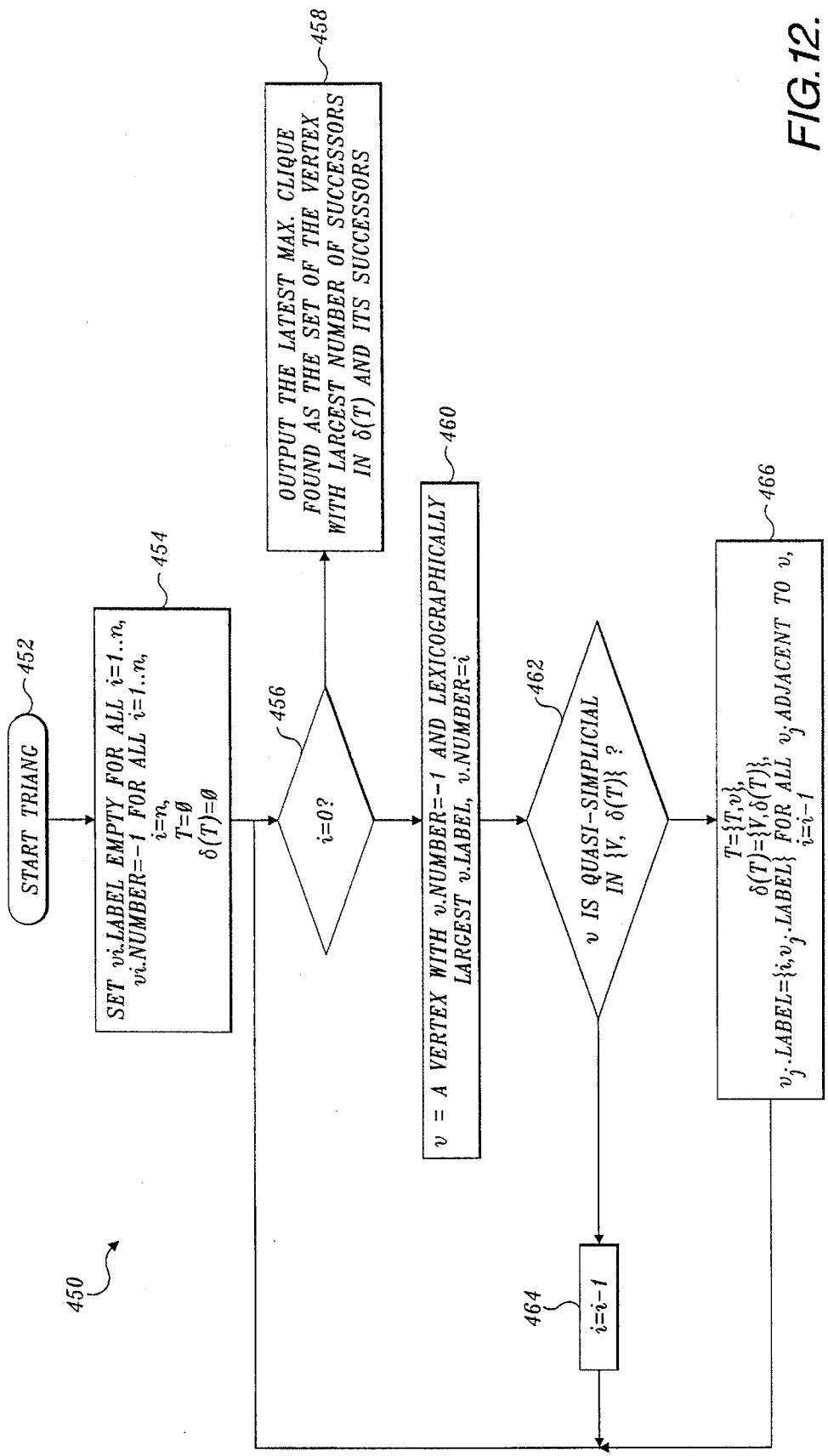
FIG. 12 is a flow chart illustrating steps comprising a function "TRIANG"
Figure 13:
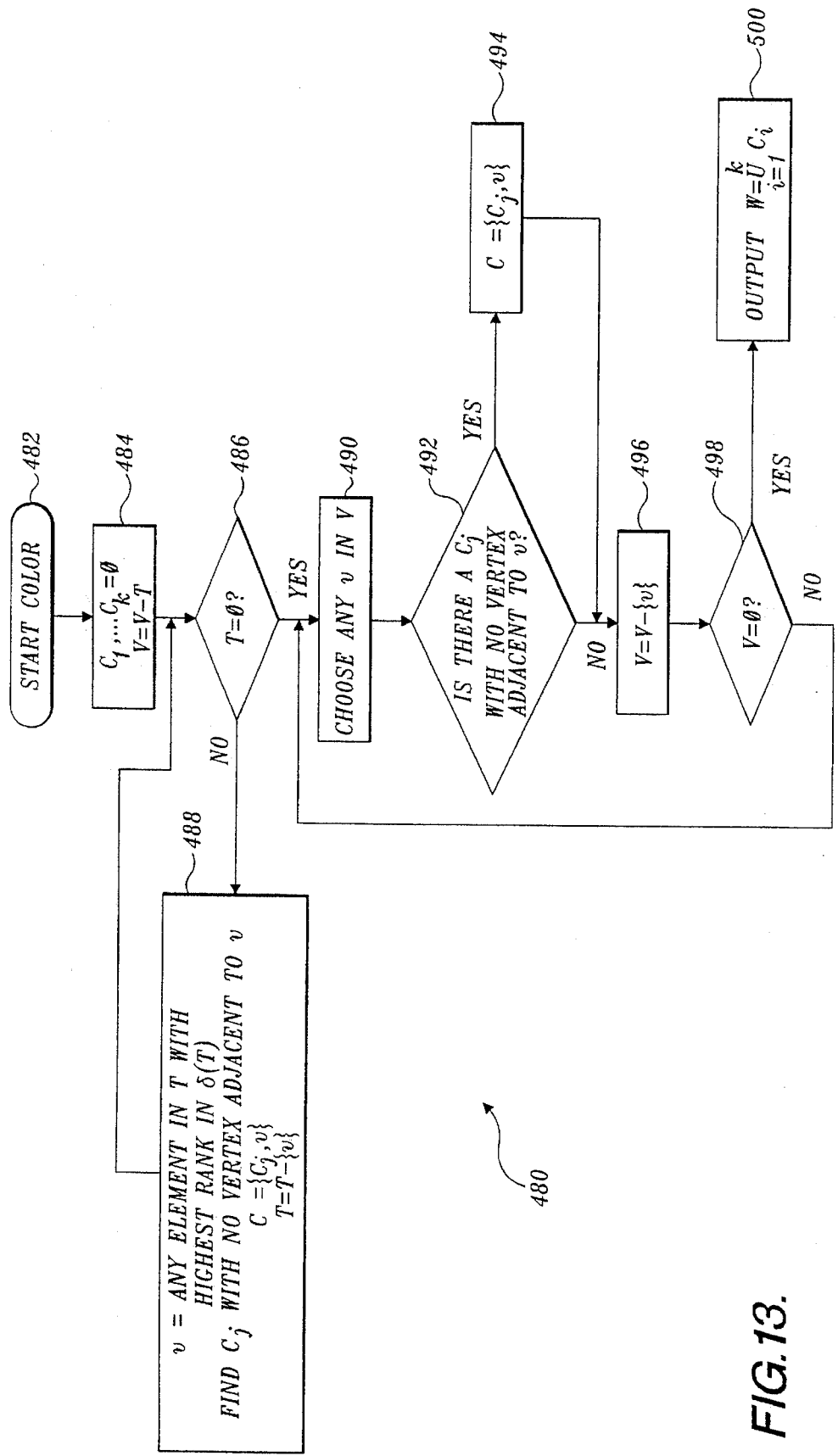
FIG. 13 is a flow chart showing step comprising a function "COLOR."

The logic implemented in the algorithm is illustrated in respect to a main procedure 400 shown in FIG. 11 and two functions 450 and 480 referred to as TRIANG and COLOR, which are shown respectively in FIGS. 12 and 13. Referring now to FIG. 11, the main procedure begins at a start block 402 and proceeds to initialize a variable i=0 in a block 404. A decision block 406 determines whether i=N, and if not (as is certainly the case with the first loop through decision block 406), branches to a decision block 408. Decision block 408 determines if a vertex $v_i$ is adjacent to at least one other vertex. By definition, two vertices $v_i$ and $v_j$ in set V are adjacent if there exists an edge $E_{ij}$ in the set E of connected edges that connects the two vertices. If a negative result is obtained in decision block 408, the logic proceeds with a block 410, which makes the set of vertices, V, equal to the previous set minus the vertex $v_i$. In other words, vertex $v_i$ is removed from the set V. Thereafter, or if the result in decision block 408 is affirmative, a block 412 increments i by one and returns to decision block 406 to repeat the loop. This loop thus eventually eliminates all vertices which are not adjacent to at least one other vertex, i.e., that are not connected by an edge to another vertex.

Following an affirmative response in decision block 406, which occurs after all N vertices are considered, the logic proceeds with a block 414 that initializes several variables. Specifically, a list of problems L is initialized to a first problem P0; a set $S_t$ is made equal to the set of vertices V; variables t and k are set equal to zero, and the two variables defining a problem, $I_t$ and $E_t$ are initialized to zero. Thereafter, in a decision block 416, an inquiry is made to determine if the list of problems L is empty. An affirmative answer would only occur after the maximal clique is found and would then direct the logic to a block 418 to provide output of the maximal clique. Until this algorithm is completed, the logic instead proceeds to a decision block 420, which determines whether the cardinality of the set of vertices V less set $E_t$ is less than or equal to k. Cardinality in this inquiry simply checks on the number of elements in the set V remaining after set $E_t$ is subtracted. If the answer to the inquiry is affirmative, a block 424 deletes problem $P_t$ from the list L, and then proceeds back to decision block 416. If the answer is negative, a decision block 422 determines if the cardinality of V–$E_t$ is greater than k AND the cardinality of $I_t$ is equal to k. An affirmative response to this inquiry leads to a block 426, which calls the function TRIANG. A value for k is defined as the cardinality of the union of the set returned by the function TRIANG and $I_t$.

Since the function TRIANG has been called in block 426, reference is made now to FIG. 12, wherein the function TRIANG starts at a block 452. In a block 454, several variables are initialized. Specifically, a variable $v_i$.LABEL is initialized to the NULL or empty set for all i=1 ... n, and a variable $v_i$.NUMBER is set equal to −1 for all i=1 ... n. In addition, i is thereafter set equal to n, T is set equal to NULL (or empty), and δ(T) is set to NULL. A decision block 456 then determines whether i=0, and if so, a block 458 provides for output of the latest maximum clique found, which is the set formed by a vertex with the largest number of "successors" in δ(T) and all its successors. By definition, δ(T) is an ordering of the set T, and the successors of the vertices $v_i$ comprising the set T are all the vertices $v_j$ (j>i) that are adjacent to $v_i$ in the graph. Furthermore, the first successor of $v_i$ is the successor with the smallest index.

Assuming that the results of the inquiry made in decision block 456 is negative, a block 460 sets v equal to a vertex with v.NUMBER=−1 and the lexicographically largest v.LABEL, where v.NUMBER=i. Thereafter a decision block 462 determines whether v is quasi-simplicial in {v, δ(T)}. By definition, $v_i$ is quasi-simplicial in δ if the first successor is adjacent to every other successor of $v_i$. If the result to the inquiry in decision block 462 is negative, a block 464 decrements i by one. Otherwise, an affirmative answer shifts to a block 466, where the set T={T, v} and δ(T)={v, δ(T)} are defined. In addition, $v_j$.LABEL is set equal to [$v_i$.LABEL] for all $v_j$ adjacent to $v_i$, and i is then decremented by one. Following blocks 464 or 466, the logic returns to decision block 456 and again continues to repeat the loop until i is equal to zero.

Referring back to FIG. 11, following block 426, a decision block 428 determines whether $T_t$ is equal to $S_t$. If the result is affirmative, the logic proceeds to block 424. Alternatively, a block 430 returns a set $W_t$ equal to the set returned by the function COLOR.

The sub-algorithm implemented by the function COLOR is shown in FIG. 13, and begins at a start block 482. Thereafter, a block 484 initializes color classes $C_1, \ldots, C_k$ equal to zero and defines the set V equal to the previous set V minus the set T. Thereafter, a decision block 486 determines whether the set T is empty, and if not a block 488 sets v equal to any element in T with the highest rank in δ(T). Block 488 also provides for finding a color class $C_j$ with no vertex adjacent to v, and sets $C_j$ equal to the {$C_j$, v} and sets T equal to T–{v}. Following block 488, the logic returns to decision block 486 to repeat the loop until set T is empty. Thereafter, a block 490 chooses any v in V, and a decision block 492 determines if there is a color class $C_j$ with no vertex adjacent to v. An affirmative result leads to a block 494, which sets $C_j$ equal to {$C_j$, v}. Thereafter, or if a negative result is obtained from decision block 492, a block 496 sets V=V–{v}.

A decision block 498 determines whether the set V is empty, and if not, loops back to block 490. However, if set V is empty, a block 500 provides for setting W equal to the union of all $C_i$, for i=1 to k.

Returning again to FIG. 11, if the response to the inquiry in decision block 422 is negative, a block 432 provides for calling the function COLOR, which also returns a set $W_t$. Thereafter, following either blocks 430 or 432, a decision block 434 determines whether set $W_t$ is equal to set $S_t$ and if not, updates the list L of problems $P_{ti}$. When the list of problems is updated, an additional problem $P_{ti}$ equal to ($I_{ti}$, $E_{ti}$) for i=1 ... to N is added to list L such that $I_{ti}$=$I_t$ U {$v_i$}, and $E_{ti}$=$E_t$ U ($S_t$–({$v_i$} U N($v_i$))) U {$v_1 \ldots v_{i-1}$}, where N($v_i$) is the set of all vertices in the graph that are connected to $v_i$. (The character "U" as used above indicates the function of "union.")

Following block 436 or an affirmative response to decision block 434, the logic returns to block 424, and thereafter, repetitively cycles back through the loop until the list of problems L is empty. At this point, the maximal clique is obtained in block 418, which represents the set of maximally compacted test vertices represented in Table 5 in respect to the preferred embodiment disclosed above.

Once the matrix of compacted vectors shown in Table 5 is obtained, it is then transposed. A second compaction of the resulting transposed matrix results from again applying the algorithm of FIGS. 11, 12, and 13. The number of rows that define the minimum length of test generator 210 and the fanout of the test generator in respect to the circuit are deduced by keeping track of correlated bits. From the correlated bits, the test vectors shown in Table 6 are developed. It will be apparent that other compaction techniques can be applied and may produce somewhat different results, perhaps providing even greater compaction than was obtained using the above algorithm.

While the present invention has been disclosed in respect to a preferred embodiment and modifications thereto, those of ordinary skill in the art will appreciate that further changes may be made within the scope of the claims that follow. Accordingly, it is intended that the scope of the invention be determined entirely by reference to the claims, and not in any way be limited by the Description of the Preferred Embodiments set forth above.

The invention in which an exclusive property or privilege is claimed is defined as follows:

1. An integrated self-testing error detection and correction circuit having a parity input, a data input, a parity output, a data output, and an error output, said circuit operating in a normal mode to detect and correct errors in data, and also operating in a self-test mode to detect internal faults within the circuit, comprising:

a. parity and syndrome generator means, connected to receive input data and parity data, for generating a parity and a syndrome in response thereto;

b. syndrome decoder and data correction means connected to receive the input data, the parity, and the syndrome generated by the parity and syndrome generator means, for decoding the syndrome and correcting an error in the input data, producing an output data signal, an output parity signal, and a detected error signal;

c. a test generator that generates self-test data that are applied to the data input and to the parity input while the circuit is not being used in the normal mode; and d. signature analyzer means connected to receive the output data signal, the syndrome, and the detected error signal, and in response thereto, producing a corresponding test signature, said signature analyzer means including means for comparing the test signature to a predetermined expected signature and producing a fault signal that indicates a fault has been detected if the test signature differs from the predetermined expected signature.

2. The circuit of claim 1, further comprising multiplexer means for selectively applying the self-test data to the parity and syndrome generator means and to the syndrome decoder and data correction means while the circuit is operating in the self-test mode, and applying a data input signal and a parity input signal to the parity and syndrome generator means and the data input signal to the syndrome decoder and data correction means while the circuit is operating in the normal mode.

3. The circuit of claim 2, further comprising controller means for initiating the self-test mode by causing the multiplexer means to connect self-test data to the parity and syndrome generator means and to the syndrome decoder and data correction means, and for controlling the signature analyzer means.

4. The circuit of claim 1, wherein the test generator comprises a linear feedback shift register and wherein the self-test mode comprises generation of a plurality of pseudo-random bit patterns by the linear feedback shift register in sufficient variety to fully self test the parity and syndrome generator means and the syndrome decoder and data correction means, each bit pattern comprising a vector of the self-test data.

5. The circuit of claim 4, wherein the linear feedback shift register produces self-test data having fewer bits than a total number of bits applied to the data input and the parity input when the circuit is operating in the normal mode, the circuit further comprising means for fanning out said fewer bits of the self-test data to provide said total number of bits.

6. The circuit of claim 5, wherein the means for fanning out the self-test data fan out predefined bits of the self-test data that are selected so as to minimize the number of vectors of the self-test data required to fully self test the parity and syndrome generator means and the syndrome decoder and data correction means.

7. The circuit of claim 1, wherein the signature analyzer means further comprise linear reduction means connected to receive the error signal, the output data signal, and the syndrome, each of which comprise a plurality of bits, for reducing the number of bits in the data output signal and in the syndrome prior to determining the signature.

8. A built-in self-test system for determining if a fully combinational integrated circuit has a fault, the integrated circuit selectively operating in either a normal mode or in a self-test mode, and having an input port to which a binary input signal is applied and an output port for producing an output signal in response to the input signal, the system comprising:

a. a self-test generator that produces a self-test signal having fewer binary bits than a normal input signal that is applied when the integrated circuit is operating in the normal mode, said self-test generator being disposed on the integrated circuit and integral therewith;

b. means for fanning out selected binary bits of the self-test signal to provide an applied self-test signal having the same number of binary bits as the normal input signal, the means for fanning out being connected to the input port of the integrated circuit, the selected bits being predetermined so as to minimize a total number of different test vectors that must be produced to substantially fully test the integrated circuit; and c. signature analyzer means disposed on the integrated circuit, integral therewith, and connected to receive the output signal of the integrated circuit produced while the integrated circuit is operating in the test mode, for producing a test signature from the output signal, and comparing the signature to a predetermined expected signature, producing a fault signal indicative of any difference between the test signature and the expected signature.

9. The self-test system of claim 8, further comprising means for selectively applying the self-test signal to the input port of the integrated circuit only during the self-test mode, so that the normal input signal is otherwise applied.

10. The self-test system of claim 8, wherein the self-test generator comprises a linear feedback shift register and wherein the self-test mode comprises generation of a plurality of pseudo-random bit patterns by the linear feedback shift register in sufficient variety to fully self test the integrated circuit, each bit pattern comprising a vector of the self-test signal.

11. The self-test system of claim 10, wherein the means for fanning out the self-test signal fan out predefined bits that are selected so as to minimize the number of vectors of the self-test signal required to fully self test the integrated circuit.

12. The self-test system of claim 8, wherein the signature analyzer means comprise linear reduction means connected to receive the output signal produced by the integrated circuit during operation in the self-test mode, for reducing the number of bits in the output signal prior to determining the test signature.

13. The self-test system of claim 8, wherein the integrated circuit includes a plurality of sub-circuits, each of which selectively operates in either the normal mode or the self-test mode and each of which includes an input port and an output port, the means for fanning out selectively applying the test vectors to each input port of the sub-circuits so that they each produce an output signal corresponding thereto, the signal analyzer means being connected to receive the output signal of the sub-circuits, producing a corresponding test signature for the sub-circuits and comparing that signature to the predetermined expected signature, producing a fault signal indicative of any difference between the test signature of the sub-circuits and the predetermined expected signature.

14. The self-test system of claim 8, further comprising a clock that produces a timing signal determining cycles of the normal mode and controller means for selectively initiating the self-test mode at least partly in response to the clock cycles.

15. The self-test system of claim 14, wherein the controller means initiate the self-test mode during portions of the clock cycles when the integrated circuit is available to process the self-test signal without interfering with the normal mode.

16. The self-test system of claim 14, wherein the controller means initiate the self-test mode prior to the start of the normal mode.

17. The self-test system of claim 14, wherein the controller means initiate the self-test mode upon receipt of a self-test initiate signal from an external source, so that the self-test mode is entered upon demand.

18. A method for integrated self testing of a fully combinational integrated circuit that operates in a normal mode in which a binary input signal is applied to an input of the integrated circuit and in response thereto, produces a corresponding output signal, comprising the steps of:

a. during operation in a test mode, generating a self-test signal having fewer binary bits than the input signal;

b. fanning out predefined binary bits of the self-test signal to provide a total number of bits equal to that of the input signal, the predefined binary bits being selected so as to minimize a total number of different test vectors that must be applied to substantially fully test the integrated circuit;

c. producing a test signature from the output signal of the integrated circuit as a result of the test vectors being applied to its input;

d. comparing the test signature to an expected signature; and e. producing a fault signal indicative of any difference between the test signature and the expected signature.

19. The method of claim 18, further comprising the step of selectively applying the self-test signal to the input of the integrated circuit only during the self-test mode, so that the normal input signal is otherwise applied.

20. The method of claim 18, where in the step of generating the self-test signal comprises the step of generating a plurality of bit patterns in sufficient variety to fully self test the integrated circuit, each bit pattern comprising a vector of the self-test signal.

21. The method of claim 20, wherein the step of fanning out includes fanning out predefined bits that are selected by compacting a set of test vectors having a total number of bits equal to that of the input signal.

22. The method of claim 18, wherein the integrated circuit includes a plurality of sub-circuits, each having an input and producing an output signal corresponding to an input signal applied to the input, the step of fanning out comprising the step of applying the test vectors to the input of each sub-circuit, so as to produce a test signature for the sub-circuits.

23. The method of claim 18, wherein the integrated circuit operates in the normal mode during intervals of time defined by clock cycles, further comprising the step of operating the integrated circuit in the self-test mode during portions of the clock cycles when the integrated circuit is available to process the self-test signal without interfering with the normal mode.

24. The method of claim 18, further comprising the step of initiating the self-test mode prior to the start of the normal mode.

25. The method of claim 18, further comprising the step of initiating the self-test mode upon receipt of a self-test initiate signal, so that the self-test mode in entered upon demand.

26. The method of claim 18, wherein the selected binary bits are determined by twice compacting bits of the test vectors to reduce the number of test vectors required to fully test the integrated circuit.

27. The method of claim 18, further comprising the step of reducing a total number of bits in the output signal produced by the integrated circuit in response to the self-test signal prior to producing the test signature.

* * * * *